(12) United States Patent
Negoro

(10) Patent No.: US 10,814,251 B2
(45) Date of Patent: Oct. 27, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventor: Sei Negoro, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/260,338

(22) Filed: Jan. 29, 2019

(65) Prior Publication Data

US 2019/0240597 A1    Aug. 8, 2019

(30) Foreign Application Priority Data

Feb. 7, 2018 (JP) .................................. 2018-19826

(51) Int. Cl.
*B01D 19/00* (2006.01)
*H01L 21/66* (2006.01)
*H01L 21/306* (2006.01)
*H01L 21/67* (2006.01)

(52) U.S. Cl.
CPC .... *B01D 19/0005* (2013.01); *H01L 21/30604* (2013.01); *H01L 21/67017* (2013.01); *H01L 21/67028* (2013.01); *H01L 21/67051* (2013.01); *H01L 21/67075* (2013.01); *H01L 22/20* (2013.01); *B01D 2257/104* (2013.01)

(58) Field of Classification Search
CPC combination set(s) only.
See application file for complete search history.

(56) References Cited

U.S. PATENT DOCUMENTS

| | | | |
|---|---|---|---|
| 2006/0130649 A1 | 6/2006 | Jain et al. | 95/82 |
| 2011/0139272 A1 | 6/2011 | Matsumoto et al. | 137/511 |
| 2013/0306238 A1 | 11/2013 | Miura et al. | 156/345.11 |
| 2015/0060406 A1* | 3/2015 | Negoro | B05D 1/36 |
| | | | 216/83 |
| 2015/0068557 A1* | 3/2015 | Negoro | B08B 3/10 |
| | | | 134/19 |
| 2015/0114432 A1* | 4/2015 | Iwata | B08B 3/02 |
| | | | 134/19 |
| 2015/0179490 A1 | 6/2015 | Yamamoto | |

FOREIGN PATENT DOCUMENTS

| | | |
|---|---|---|
| CN | 101765680 A | 6/2010 |
| JP | 2013-258391 A | 12/2013 |
| KR | 10-2010-0039850 A | 4/2010 |
| KR | 10-2014-0086850 A | 7/2014 |
| TW | I399236 B | 6/2013 |
| TW | I501346 B | 9/2015 |

\* cited by examiner

*Primary Examiner* — Mounir S Amer
(74) *Attorney, Agent, or Firm* — Ostrolenk Faber LLP

(57) ABSTRACT

Processing liquid is stored by a supply tank. The dissolved oxygen concentration of the processing liquid is measured. The dissolved oxygen concentration of the processing liquid in the supply tank is adjusted by supplying concentration adjusting gas having a concentration of inert gas higher than that of air into the supply tank in accordance with the dissolved oxygen concentration of the processing liquid measured. The processing liquid in the supply tank is supplied to a substrate. The processing liquid that has been supplied to the substrate is collected to the supply tank. Unnecessary gas that is a gas other than the concentration adjusting gas and dissolved in the processing liquid during the processing of the substrate is decreased from the processing liquid before the processing liquid is collected to the supply tank.

9 Claims, 11 Drawing Sheets

SUBSTRATE PROCESSING METHOD AND SUBSTRATE PROCESSING APPARATUS

CROSS REFERENCE TO RELATED APPLICATIONS

This application claims the benefit of priority to Japanese Patent Application No. 2018-019826 filed on Feb. 7, 2018. The entire contents of this application are hereby incorporated herein by reference.

BACKGROUND OF THE INVENTION

1. Field of the Invention

The present invention relates to a substrate processing method and a substrate processing apparatus that process a substrate. Examples of substrates to be processed include a semiconductor wafer, a substrate for a flat panel display (FPD) such as a liquid crystal display and an organic electroluminescence (organic EL) display, a substrate for an optical disc, a substrate for a magnetic disk, a substrate for a magneto-optical disc, a substrate for a photomask, a ceramic substrate, a substrate for a solar cell, and the like.

2. Description of Related Art

In the manufacturing process of a semiconductor device, a liquid crystal display, etc., a substrate processing apparatus is used which processes a substrate such as a semiconductor wafer or a glass substrate for a liquid crystal display.

JP 2013-258391 A discloses a substrate processing apparatus that supplies nitrogen gas or dry air into a tank storing TMAH (tetramethylammonium hydroxide) and adjusts the dissolved oxygen concentration of TMAH to an optimal value. The type of gas to be supplied into the tank is changed based on detected values of a dissolved gas sensor that detects the dissolved oxygen concentration of TMAH.

SUMMARY OF THE INVENTION

Although it is not disclosed in JP 2013-258391 A, there is a case where the processing liquid that has been supplied to the substrate is collected and reused. The collected processing liquid contains gas in the atmosphere. The collected processing liquid might contain gas generated due to chemical reaction between the substrate and the processing liquid. These gasses could contain gas other than oxygen gas and inert gas. Gas other than oxygen gas and inert gas could degrade the detection precision of an oxygen meter that detects the dissolved oxygen concentration of the processing liquid. In this case, the actual dissolved oxygen concentration of the processing liquid is adjusted to a value different from the target concentration.

Therefore, an object of the present invention is to provide a substrate processing method and a substrate processing apparatus that are capable of processing substrates with extremely stable quality even when reusing a processing liquid a dissolved oxygen concentration of which is adjusted.

A preferred embodiment of the present invention provides a substrate processing method including a processing liquid storing step of storing a processing liquid by a supplying tank, a dissolved oxygen concentration measuring step of measuring a dissolved oxygen concentration of the processing liquid, a dissolved oxygen concentration adjusting step of adjusting the dissolved oxygen concentration of the processing liquid stored in the supplying tank by supplying a concentration adjusting gas having a concentration of inert gas higher than that of air into the supply tank in accordance with the dissolved oxygen concentration of the processing liquid measured in the dissolved oxygen concentration measuring step, a processing liquid supplying step of supplying the processing liquid in the supplying tank to a substrate, a processing liquid collecting step of collecting the processing liquid that has been supplied to the substrate into the supply tank, and an unnecessary gas decreasing step of decreasing an unnecessary gas, that is a gas other than the concentration adjusting gas and dissolved in the processing liquid in the processing liquid supplying step, from the processing liquid before the processing liquid that has been supplied to the substrate is collected into the supply tank.

According to this method, the dissolved oxygen concentration of the processing liquid is measured. The concentration adjusting gas having the concentration of inert gas higher than that of air is supplied into the supply tank. Thus, the concentration adjusting gas is dissolved in the processing liquid in the supply tank. The flow rate or the composition of the concentration adjusting gas is changed based on the measured values of the oxygen meter. Thus, the dissolved oxygen concentration of the processing liquid is adjusted.

The processing liquid in the supply tank is supplied to the substrate. When the processing liquid is supplied to the substrate, the processing liquid and the atmosphere contact with each other. Thus, gas contained in the atmosphere such as oxygen gas is dissolved in the processing liquid that has been supplied to the substrate, and the dissolved oxygen concentration increases. There is a case where gas generated due to chemical reaction between the substrate and the processing liquid is also dissolved in the processing liquid. Gas other than the concentration adjusting gas could degrade the detection precision of the oxygen meter that detects the dissolved oxygen concentration of the processing liquid.

The unnecessary gas dissolved in the processing liquid during the processing of the substrate is decreased before the processing liquid is collected to the supply tank. Thus, even when the processing liquid in the supply tank contains the processing liquid that has been supplied to the substrate, the measurement error of the dissolved oxygen concentration due to the unnecessary gas can be decreased to zero or a small value, and the actual dissolved oxygen concentration of the processing liquid can be approached to the target concentration. Accordingly, it is possible to process substrates with extremely stable quality even when reusing the processing liquid the dissolved oxygen concentration of which is adjusted.

In the preferred embodiment, at least one of the following features may be added to the substrate processing method.

The unnecessary gas decreasing step includes a degassing step of decreasing a total amount of gas dissolved in the processing liquid before the processing liquid that has been supplied to the substrate is collected into the supply tank.

According to this method, not only the unnecessary gas but also gas other than that is reduced from the processing liquid before the processing liquid is collected into the supply tank. That is, regardless of the type of gas, all gases dissolved in the processing liquid are reduced. Thus, the total amount of the gas dissolved in the processing liquid is decreased, so that the unnecessary gas to flow into the supply tank is decreased.

The unnecessary gas decreasing step includes a gas dissolving step of replacing the unnecessary gas dissolved in the processing liquid with the concentration adjusting gas by dissolving the concentration adjusting gas into the processing liquid before the processing liquid that has been supplied to the substrate is collected into the supply tank.

According to this method, the concentration adjusting gas is supplied to the processing liquid that has been supplied to the substrate, and the concentration adjusting gas is dissolved in the processing liquid. The unnecessary gas dissolved in the processing liquid is removed from the processing liquid by the supply of the concentration adjusting gas and replaced with the concentration adjusting gas. Thus, the unnecessary gas to flow into the supply tank is decreased and the measurement error of the dissolved oxygen concentration due to the unnecessary gas can be decreased to zero or a small value.

The processing liquid collecting step includes an intermediate collecting step of causing the processing liquid to flow into a collecting tank before the processing liquid that has been supplied to the substrate is collected into the supply tank, and the unnecessary gas decreasing step includes a step of decreasing the unnecessary gas from the processing liquid in the collecting tank.

According to this method, the unnecessary gas is decreased not from the processing liquid flowing inside a piping, but from the processing liquid in the collecting tank. After that, the processing liquid is collected from the collecting tank to the supply tank. A tank is able to hold a large amount of liquid in one place as compared with a piping. Thus, the unnecessary gas is simultaneously removed from a large amount of the processing liquid as compared with a case where the unnecessary gas is removed from the processing liquid flowing inside a piping. Accordingly, the unnecessary gas can be effectively removed.

The unnecessary gas decreasing step includes a gas dissolving step of dissolving the concentration adjusting gas into the processing liquid in the collecting tank by supplying the concentration adjusting gas into the collecting tank.

According to this method, the concentration adjusting gas is supplied to the collecting tank and dissolves into the processing liquid in the collecting tank. The unnecessary gas dissolved in the processing liquid is removed from the processing liquid by the supply of the concentration adjusting gas and replaced with the concentration adjusting gas. After that, the processing liquid is collected from the collecting tank to the supply. Even in the supply tank, the concentration adjusting gas is supplied and dissolves into the processing liquid. Thus, the concentration adjusting gas is supplied not only to the processing liquid in the supply tank, but also to the processing liquid in the collecting tank.

In this way, the dissolved oxygen concentration of the processing liquid is adjusted in the collecting tank, and then adjusted in the supply tank. That is, the dissolved oxygen concentration of the processing liquid is adjusted in a stepwise manner. Thus, the dissolved oxygen concentration of the processing liquid is precisely approached to the target concentration as compared with a case where the dissolved oxygen concentration of the processing liquid is adjusted only in a single tank. Further, even when the difference between the actual oxygen concentration and the target concentration is large, the dissolved oxygen concentration of the processing liquid is approached to the target concentration.

The processing liquid collecting step includes an upstream collecting step of causing the processing liquid to flow into an upstream tank before the processing liquid that has been supplied to the substrate is collected into the supply tank, and a downstream collecting step of causing the processing liquid to flow from the upstream tank to a downstream tank before the processing liquid in the upstream tank is collected into the supply tank, and the unnecessary gas decreasing step includes a degassing step of decreasing a total amount of gas dissolved in the processing liquid in the upstream tank, and a gas dissolving step of dissolving the concentration adjusting gas into the processing liquid in the downstream tank by supplying the concentration adjusting gas into the downstream tank.

According to this method, the processing liquid that has been supplied to the substrate flows into the upstream tank, the downstream tank and the supply tank in this order. In the upstream tank, all gases including the unnecessary gas are removed from the processing liquid. In the downstream tank, the unnecessary gas dissolved in the processing liquid is replaced with the concentration adjusting gas. Thus, the supply tank receives the processing liquid containing an extremely small amount of the unnecessary gas and having the adjusted dissolved oxygen concentration. Accordingly, the dissolved oxygen concentration of the processing liquid in the supply tank is likely to approach the target concentration in a short time.

The processing liquid collecting step includes an intermediate collecting step of causing the processing liquid to flow into a collecting tank before the processing liquid that has been supplied to the substrate is collected into the supply tank, the substrate processing method further includes a liquid temperature determining step of determining whether or not a temperature of the processing liquid in the supply tank is not greater than a reference temperature, the unnecessary gas decreasing step includes a step of decreasing the unnecessary gas from the processing liquid in the collecting tank when the temperature of the processing liquid is determined to be not greater than the reference temperature in the liquid temperature determining step, and the processing liquid collecting step includes a step of sending the processing liquid in the collecting tank toward the supply tank without decreasing the unnecessary gas from the processing liquid in the collecting tank when the temperature of the processing liquid is determined to be greater than the reference temperature in the liquid temperature determining step.

According to this method, when the temperature of the processing liquid is not greater than the reference temperature, the unnecessary gas is removed from the processing liquid in the collecting tank, and the processing liquid from which the unnecessary gas has been removed is sent from the collecting tank toward the supply tank. On the other hand, when the temperature of the processing liquid is greater than the reference temperature, the removal of the unnecessary gas is not performed, and the processing liquid from which the unnecessary gas has not been removed is sent from the collecting tank toward the supply tank. That is, it is determined whether or not the removal of the unnecessary gas at the collecting tank is performed in accordance with the temperature of the processing liquid.

The reactivity of the processing liquid to the substrate usually increases as the temperature of the processing liquid rises. When the temperature of the processing liquid is high, there is a case where the influence of the temperature is so large that the influence of changes in the dissolved oxygen concentration on quality of processed substrates can be ignored. In this case, if the temperature of the processing liquid is precisely controlled, substrates are processed with extremely stable quality without performing the removal of the unnecessary gas. Thus, a process to collect the processing liquid that has been supplied to the substrate into the supply tank can be simplified.

The reference temperature is a temperature higher than a room temperature and lower than the boiling point of the processing liquid. Whether or not the temperature of the processing liquid in the supply is not greater than the reference temperature may be determined based on a measured value of a thermometer that measures the temperature of the processing liquid, or may be determined based on a preset temperature of a temperature controller that heats or cools the processing liquid. When a plurality of collecting tanks are provided, the removal of the unnecessary gas may be omitted at all the collecting tanks, or may be omitted at some of collecting tanks.

The processing liquid collecting step includes an intermediate collecting step of causing the processing liquid to flow into a collecting tank before the processing liquid that has been supplied to the substrate is collected into the supply tank, the substrate processing method further includes an unnecessary gas concentration measuring step of measuring a concentration of the unnecessary gas in the processing liquid before the processing liquid that has been supplied to the substrate is sent from the collecting tank toward the supply tank, and a concentration determining step of determining whether or not the concentration of the unnecessary gas in the processing liquid measured in the unnecessary gas concentration measuring step is not less than a reference concentration, the unnecessary gas decreasing step includes a step of decreasing the unnecessary gas from the processing liquid in the collecting tank when the concentration of the unnecessary gas is determined to be not less than the reference concentration in the concentration determining step, the processing liquid collecting step includes a step of sending the processing liquid in the collecting tank toward the supply tank without decreasing the unnecessary gas from the processing liquid in the collecting tank when the concentration of the unnecessary gas is determined to be less than the reference concentration in the concentration determining step.

According to this method, when the concentration of the unnecessary gas in the processing liquid is not less than the reference concentration, the unnecessary gas is removed from the processing liquid in the collecting tank, and the processing liquid from which the unnecessary gas has been removed is sent from the collecting tank toward the supply tank. On the other hand, when the concentration of the unnecessary gas in the processing liquid is less than the reference concentration, the removal of the unnecessary gas is not performed, and the processing liquid from which the unnecessary gas has not been removed is sent from the collecting tank toward the supply tank. That is, it is determined whether or not the removal of the unnecessary gas at the collecting tank is performed in accordance with the concentration of the unnecessary gas.

When the concentration of the unnecessary gas in the processing liquid is low, there is a case where the measurement error of the dissolved oxygen concentration due to the unnecessary gas is negligibly small. In this case, the processing liquid in which the dissolved oxygen concentration is stable can be supplied to the substrate without removing the unnecessary gas from the collected processing liquid. When a plurality of collecting tanks are provided, the removal of the unnecessary gas may be omitted at all the collecting tanks, or may be omitted at some of collecting tanks.

The processing liquid collecting step further includes a first collecting step of causing the processing liquid to flow into a first upstream tank without causing the processing liquid to flow into a second tank that is connected in parallel to the first tank before the processing liquid that has been supplied to the substrate is collected into the supply tank, and a second collecting step of causing the processing liquid to flow into the second upstream tank without causing the processing liquid to flow into the first tank before the processing liquid that has been supplied to the substrate is collected into the supply tank, and the unnecessary gas decreasing step includes a first unnecessary gas decreasing step of decreasing the unnecessary gas from the processing liquid in the first upstream tank in parallel to the second collecting step, and a second unnecessary gas decreasing step of decreasing the unnecessary gas from the processing liquid in the second upstream tank in parallel to the first collecting step.

According to this method, the processing liquid is collected to the first upstream tank and the second upstream tank that are collected in parallel to each other. When the processing liquid is collected to the first upstream tank, collecting the processing liquid to the second upstream tank is stopped. At this time, the unnecessary gas is removed from the processing liquid in the second upstream tank. On the other hand, when the processing liquid is collected to the second upstream tank, collecting the processing liquid to the first upstream tank is stopped. At this time, the unnecessary gas is removed from the processing liquid in the first upstream tank. Thus, when the unnecessary gas is being removed from the processing liquid, there is no need to stop supplying the processing liquid to the substrate. Accordingly, it is possible to prevent throughput (number of substrates processed per unit time) of the substrate processing apparatus from decreasing.

Another preferred embodiment of the present invention provides a substrate processing apparatus includes a supply tank that stores a processing liquid, an oxygen meter that measures a dissolved oxygen concentration of the processing liquid, a dissolved oxygen concentration adjusting unit that adjusts the dissolved oxygen concentration of the processing liquid stored in the supplying tank by supplying a concentration adjusting gas having a concentration of inert gas higher than that of air into the supply tank in accordance with the dissolved oxygen concentration of the processing liquid measured by the oxygen meter, a processing liquid supplying unit that supplies the processing liquid in the supplying tank to a substrate, a processing liquid collecting unit that collects the processing liquid that has been supplied to the substrate into the supply tank, and an unnecessary gas decreasing unit that decreases an unnecessary gas, that is a gas other than the concentration adjusting gas and dissolved in the processing liquid when the processing liquid is supplied to the substrate, from the processing liquid before the processing liquid that has been supplied to the substrate is collected into the supply tank. According to this arrangement, the same effects as the effects described above regarding the substrate processing method can be obtained.

In the preferred embodiment, at least one of the following features may be added to the substrate processing apparatus.

The unnecessary gas decreasing unit includes a degasifier that decreases a total amount of gas dissolved in the processing liquid before the processing liquid that has been supplied to the substrate is collected into the supply tank. According to this arrangement, the same effects as the effects described above regarding the substrate processing method can be obtained.

The unnecessary gas decreasing unit includes a gas dissolving unit that replaces the unnecessary gas dissolved in the processing liquid with the concentration adjusting gas by dissolving the concentration adjusting gas into the processing liquid before the processing liquid that has been supplied to the substrate is collected into the supply tank. According to this arrangement, the same effects as the effects described above regarding the substrate processing method can be obtained.

The processing liquid collecting unit includes a collecting tank that stores the processing liquid before the processing liquid that has been supplied to the substrate is collected into the supply tank, and the unnecessary gas decreasing unit decreases the unnecessary gas from the processing liquid in the collecting tank. According to this arrangement, the same effects as the effects described above regarding the substrate processing method can be obtained.

The unnecessary gas decreasing unit includes a gas dissolving unit that dissolves the concentration adjusting gas into the processing liquid in the collecting tank by supplying the concentration adjusting gas into the collecting tank. According to this arrangement, the same effects as the effects described above regarding the substrate processing method can be obtained.

The processing liquid collecting unit further includes an upstream tank that stores the processing liquid before the processing liquid that has been supplied to the substrate is collected into the supply tank, and a downstream tank that stores the processing liquid before the processing liquid in the upstream tank is collected into the supply tank, and the unnecessary gas decreasing unit includes a degasifier that decreases a total amount of gas dissolved in the processing liquid in the upstream tank, and a gas dissolving unit that dissolves the concentration adjusting gas into the processing liquid in the downstream tank by supplying the concentration adjusting gas into the downstream tank. According to this arrangement, the same effects as the effects described above regarding the substrate processing method can be obtained.

The processing liquid collecting unit includes a collecting tank that stores the processing liquid before the processing liquid that has been supplied to the substrate is collected into the supply tank, the substrate processing apparatus further includes a controller that controls the processing liquid collecting unit and the unnecessary gas decreasing unit and includes a temperature determining portion that determines whether or not a temperature of the processing liquid in the supply tank is not greater than a reference temperature, when the controller has determined that the temperature of the processing liquid is not greater than the reference temperature, the controller causes the unnecessary gas decreasing unit to decrease the unnecessary gas from the processing liquid in the collecting tank, and when the controller has determined that the temperature of the processing liquid is greater than the reference temperature, the controller causes the processing liquid collecting unit to send the processing liquid in the collecting tank toward the supply tank without causing the unnecessary gas decreasing unit to decrease the unnecessary gas from the processing liquid in the collecting tank. According to this arrangement, the same effects as the effects described above regarding the substrate processing method can be obtained.

The processing liquid collecting unit includes a collecting tank that stores the processing liquid before the processing liquid that has been supplied to the substrate is collected into the supply tank, the substrate processing apparatus further includes an unnecessary gas meter that measures a concentration of the unnecessary gas in the processing liquid before the processing liquid that has been supplied to the substrate is sent from the collecting tank toward the supply tank, and a controller that controls the processing liquid collecting unit and the unnecessary gas decreasing unit and includes a concentration determining portion that determines whether or not the concentration of the unnecessary gas is not less than a reference concentration based on measured values of the unnecessary gas meter, when the controller has determined that the concentration of the unnecessary gas is not less than the reference concentration, the controller causes the unnecessary gas decreasing unit to decrease the unnecessary gas from the processing liquid in the collecting tank, and when the controller has determined that the concentration of the unnecessary gas is less than the reference concentration, the controller causes the processing liquid collecting unit to send the processing liquid in the collecting tank toward the supply tank without causing the unnecessary gas decreasing unit to decrease the unnecessary gas from the processing liquid in the collecting tank. According to this arrangement, the same effects as the effects described above regarding the substrate processing method can be obtained.

The processing liquid collecting includes a first upstream tank that stores the processing liquid before the processing liquid that has been supplied to the substrate is collected into the supply tank, a second upstream tank that is connected in parallel to the first upstream tank and stores the processing liquid before the processing liquid that has been supplied to the substrate is collected into the supply tank, and a collecting switching valve that switches between a first collecting state in which the processing liquid that has been supplied to the substrate flows into the first upstream tank without flowing into the second upstream tank, and a second collecting state in which the processing liquid that has been supplied to the substrate flows into the second upstream tank without flowing into the first upstream tank, and the unnecessary gas decreasing unit includes a first unnecessary gas decreasing unit that decreases the unnecessary gas from the processing liquid in the first upstream tank, and a second unnecessary gas decreasing unit that decreases the unnecessary gas from the processing liquid in the second upstream tank. According to this arrangement, the same effects as the effects described above regarding the substrate processing method can be obtained.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
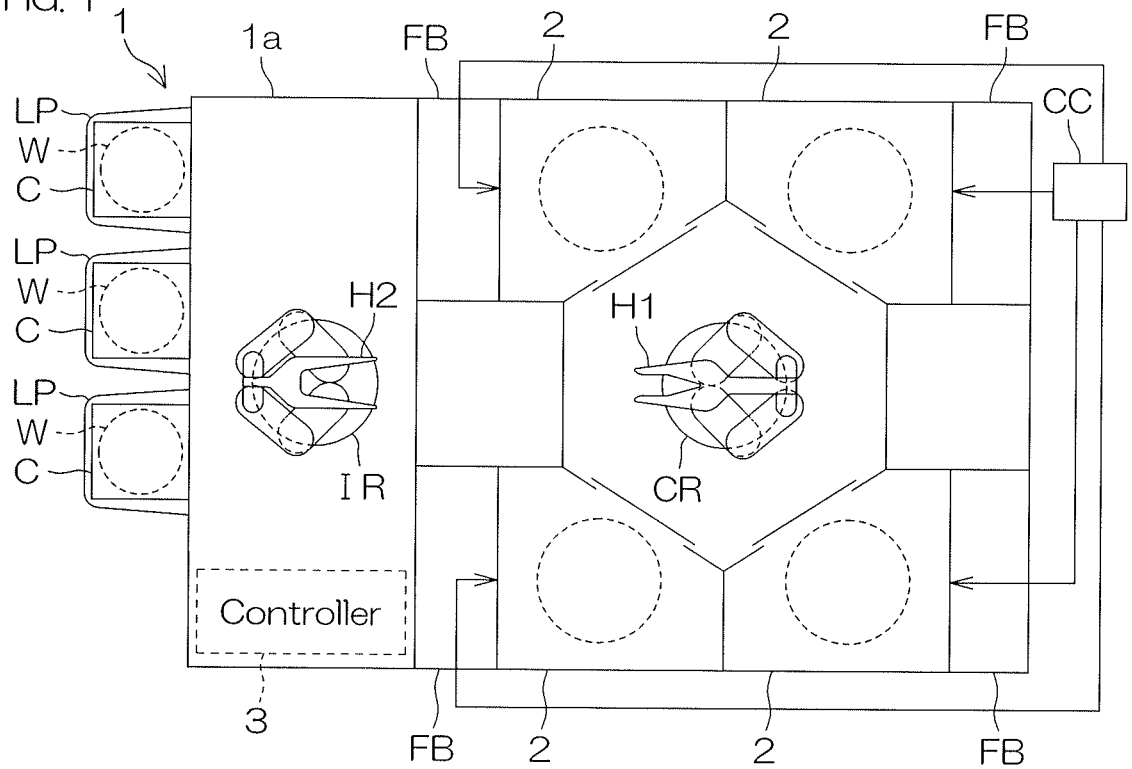
FIG. 1 is a schematic view of a substrate processing apparatus according to a first preferred embodiment of the present invention when the substrate processing apparatus is viewed from above.
Figure 2:
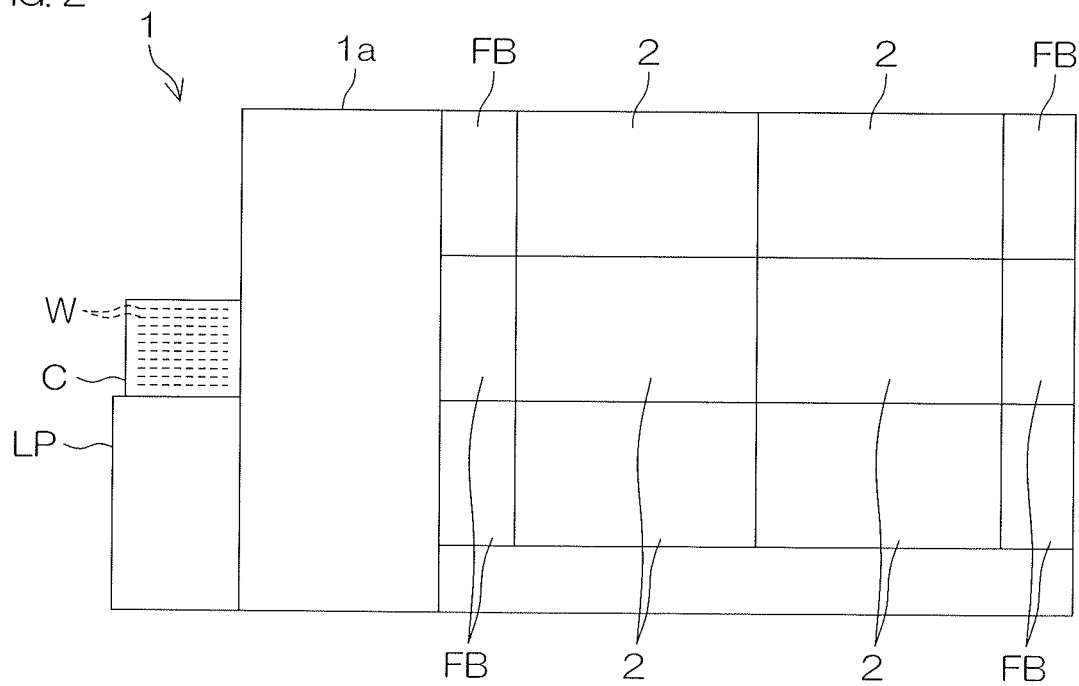
FIG. 2 is a schematic view of the substrate processing apparatus when the substrate processing apparatus is viewed from a side.

FIG. 1 is a schematic view of a substrate processing apparatus 1 according to a first preferred embodiment of the present invention when the substrate processing apparatus 1 is viewed from above. FIG. 2 is a schematic view of the substrate processing apparatus 1 when the substrate processing apparatus 1 is viewed from a side.

As shown in FIG. 1, the substrate processing apparatus 1 is a single substrate processing-type apparatus which processes disc-shaped substrates W such as a semiconductor wafer one by one. The substrate processing apparatus 1 includes load ports LP which hold carriers C that house one or more substrates W, a plurality of processing units 2 which process the substrates W transferred from the carriers C on the load ports LP with a processing fluid such as a processing liquid or a processing gas, transfer robots which transfer the substrates W between the carriers C on the load ports LP and the processing units 2 and a controller 3 which controls the substrate processing apparatus 1.

The transfer robots include an indexer robot IR which carries the substrates W into and out from the carriers C on the load ports LP and a center robot CR which carries the substrates W into and out from the processing units 2. The indexer robot IR transfers the substrates W between the load ports LP and the center robot CR, the center robot CR transfers the substrates W between the indexer robot IR and the processing units 2. The center robot CR and the indexer robot IR include hands H1 and H2 which support the substrates W, respectively.

The substrate processing apparatus 1 includes a plurality of (for example, four) fluid boxes FB, each of which houses a fluid device such as valve. A chemical liquid cabinet CC which houses a tank for chemical liquid and so on is arranged outside the outer wall 1a of the substrate processing apparatus 1. The chemical liquid cabinet CC may be arranged laterally of the substrate processing apparatus 1 or may be arranged below a clean room in which the substrate processing apparatus 1 is installed (underground).

The plurality of processing units 2 form a plurality of towers arranged around the center robot CR in a plan view. FIG. 1 shows an example in which four towers are formed. As shown in FIG. 2, each of the towers includes the plurality of (for example, three) processing units 2 which are stacked vertically. The four fluid boxes FB correspond to the four towers, respectively. A chemical liquid inside the chemical liquid cabinet CC is supplied via any of the fluid boxes FB to all the processing units 2 included in the tower corresponding to the fluid box FB.

Figure 3:
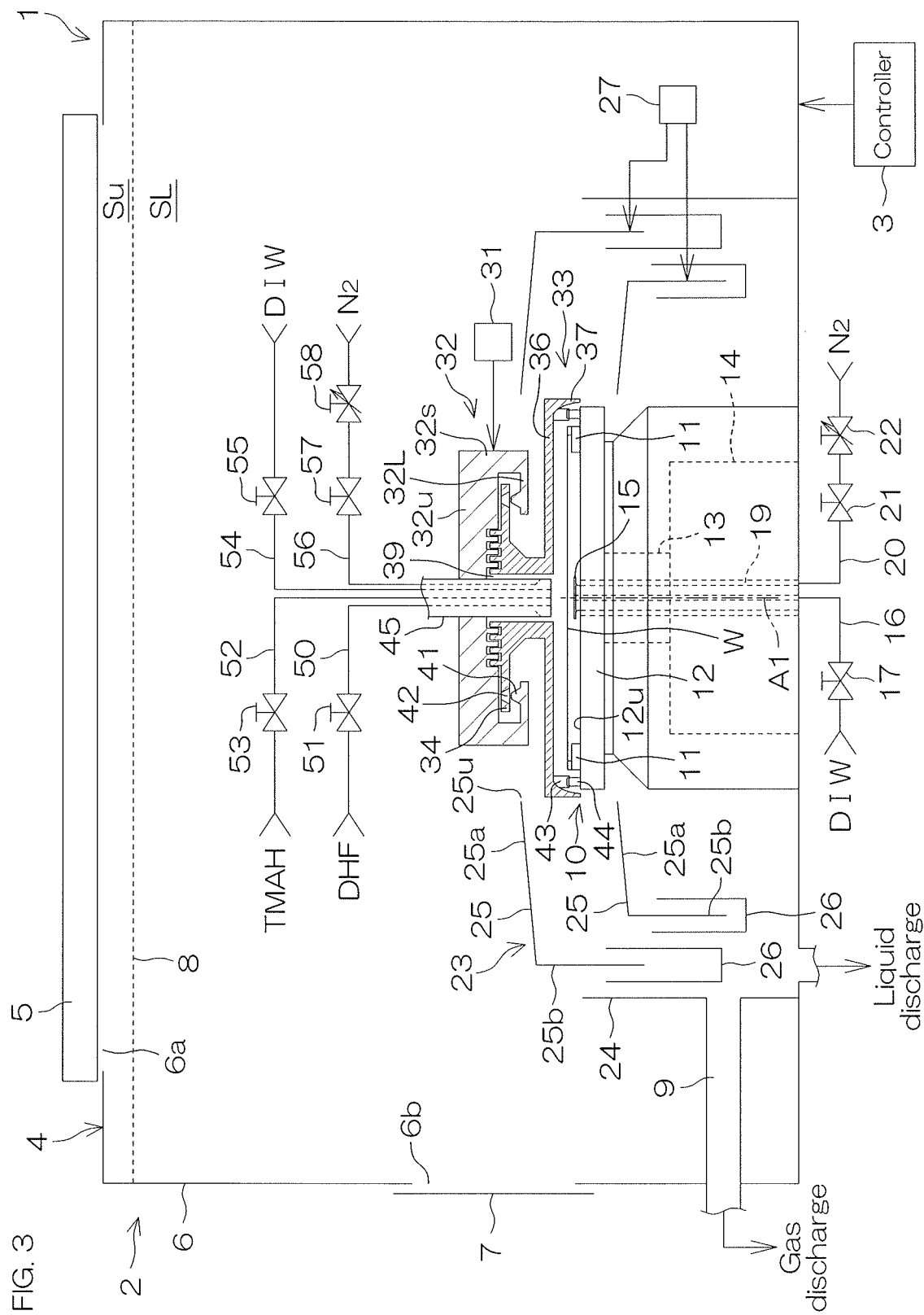
FIG. 3 is a schematic view of the interior of a processing unit included in the substrate processing apparatus when the interior is viewed horizontally.
Figure 4:
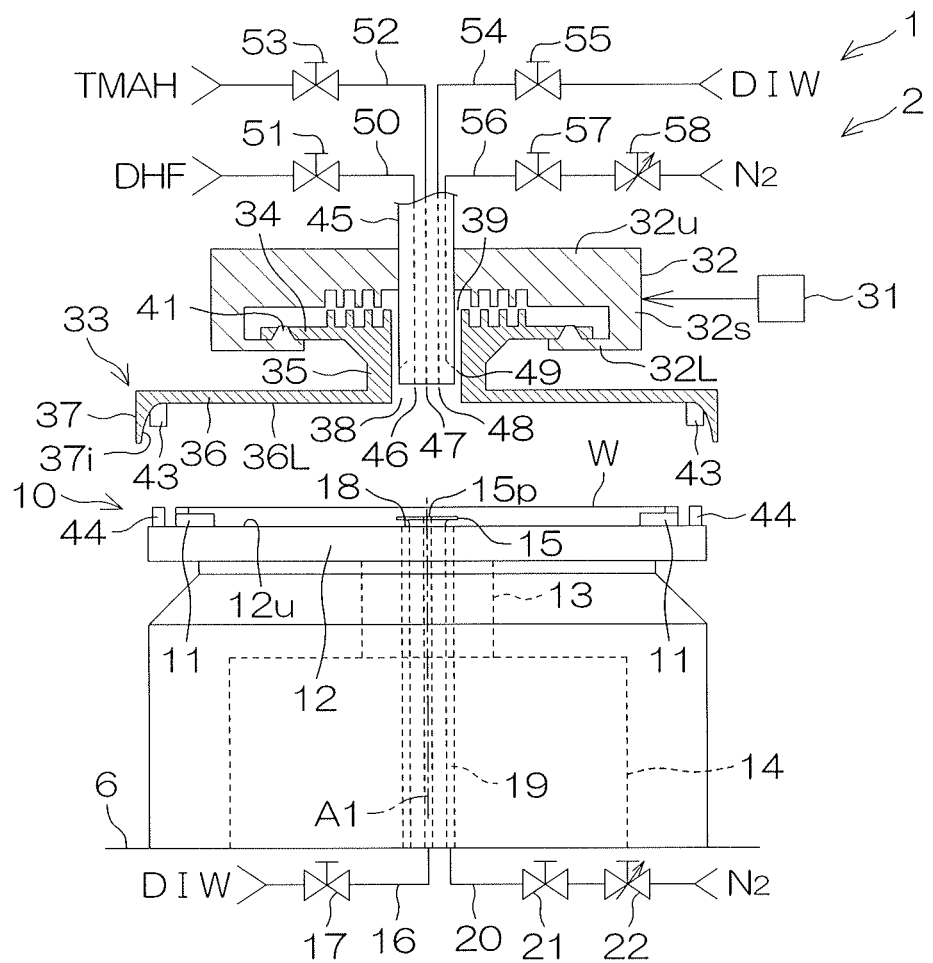
FIG. 4 is a partially enlarged view of FIG. 3.

FIG. 3 is a schematic view of the interior of the processing unit 2 included in the substrate processing apparatus 1 when the interior is viewed horizontally. FIG. 4 is a partially enlarged view of FIG. 3. FIG. 3 shows a state where a raising/lowering frame 32 and a shielding member 33 are positioned in a lower position, and FIG. 4 shows a state where the raising/lowering frame 32 and the shielding member 33 are positioned in an upper position.

The processing unit 2 includes a box-shaped chamber 4 which has an internal space, a spin chuck 10 which rotates one substrate W around a vertical rotation axis A1 passing through the central portion of the substrate W while holding the substrate W horizontally within the chamber 4 and a tubular processing cup 23 which surrounds the spin chuck 10 around the rotation axis A1.

The chamber 4 includes a box-shaped partition wall 6 provided with a carry-in/carry-out port 6b through which the substrate W passes, and a shutter 7 which opens and closes the carry-in/carry-out port 6b. The chamber 4 further includes a rectifying plate 8 which is arranged below an air outlet 6a that is open in the ceiling surface of the partition wall 6. An FFU 5 (fan filter unit) which feeds clean air (air filtered by a filter) is arranged on the air outlet 6a. An exhaust duct 9 which discharges a gas within the chamber 4 is connected to the processing cup 23. The air outlet 6a is provided in an upper end portion of the chamber 4, and the exhaust duct 9 is arranged in a lower end portion of the chamber 4. A portion of the exhaust duct 9 is arranged outside the chamber 4.

The rectifying plate 8 partitions the internal space of the partition wall 6 into an upper space Su above the rectifying plate 8 and a lower space SL below the rectifying plate 8. The upper space Su between the ceiling surface of the partition wall 6 and the upper surface of the rectifying plate 8 is a diffusion space in which the clean air diffuses. The lower space SL between the lower surface of the rectifying plate 8 and the floor surface of the partition wall 6 is a processing space in which the substrate W is processed. The spin chuck 10 and the processing cup 23 are arranged in the lower space SL. A distance in a vertical direction from the floor surface of the partition wall 6 to the lower surface of the rectifying plate 8 is longer than a distance in the vertical direction from the upper surface of the rectifying plate 8 to the ceiling surface of the partition wall 6.

The FFU 5 feeds the clean air via the air outlet 6a to the upper space Su. The clean air supplied to the upper space Su hits the rectifying plate 8 and diffuses in the upper space Su. The clean air within the upper space Su passes through a plurality of through holes which vertically penetrate the rectifying plate 8, and flows downward from the entire region of the rectifying plate 8. The clean air supplied to the lower space SL is sucked into the processing cup 23 and is discharged through the exhaust duct 9 from the lower end portion of the chamber 4. Thus, a uniform downward flow (down flow) of the clean air which flows downward from the rectifying plate 8 is formed in the lower space SL. The processing of the substrate W is performed in a state where the downward flow of the clean air is formed.

The spin chuck 10 includes a disc-shaped spin base 12 which is held by a horizontal posture, a plurality of chuck pins 11 which hold the substrate W in the horizontal posture above the spin base 12, a spin shaft 13 which extends downward from the central portion of the spin base 12 and a spin motor 14 which rotates the spin shaft 13 so as to rotate the spin base 12 and the chuck pins 11. The spin chuck 10 is not limited to a clamping type chuck which brings the chuck pins 11 into contact with the outer circumferential surface of the substrate W, and the spin chuck 10 may be a vacuum-type chuck which sucks the rear surface (lower surface) of the substrate W that is a non-device formation surface to the upper surface 12u of the spin base 12 so as to hold the substrate W horizontally.

The spin base 12 includes the upper surface 12u which is arranged below the substrate W. The upper surface 12u of the spin base 12 is parallel to the lower surface of the substrate W. The upper surface 12u of the spin base 12 is an opposed surface which faces the lower surface of the substrate W. The upper surface 12u of the spin base 12 has a circular ring shaped configuration which surrounds the rotation axis A1. The outside diameter of the upper surface 12u of the spin base 12 is larger than that of the substrate W. The chuck pins 11 protrude upward from the outer circumferential portion of the upper surface 12u of the spin base 12. The chuck pins 11 are held on the spin base 12. The substrate W is held on the chuck pins 11 in a state where the lower surface of the substrate W is separated from the upper surface 12u of the spin base 12.

The processing unit 2 includes a lower surface nozzle 15 which discharges the processing liquid toward the central portion of the lower surface of the substrate W. The lower surface nozzle 15 includes a nozzle disc portion which is arranged between the upper surface 12u of the spin base 12 and the lower surface of the substrate W and a nozzle tubular portion which extends downward from the nozzle disc portion. The liquid discharge port 15p of the lower surface nozzle 15 is open in the central portion of the upper surface of the nozzle disc portion. In a state where the substrate W is held on the spin chuck 10, the liquid discharge port 15p of the lower surface nozzle 15 faces the central portion of the lower surface of the substrate W.

The substrate processing apparatus 1 includes a lower rinse liquid piping 16 which guides a rinse liquid to the lower surface nozzle 15 and a lower rinse liquid valve 17 which is interposed in the lower rinse liquid piping 16. When the lower rinse liquid valve 17 is opened, the rinse liquid guided by the lower rinse liquid piping 16 is discharged upward from the lower surface nozzle 15 and supplied to the central portion of the lower surface of the substrate W. The rinse liquid supplied to the lower surface nozzle 15 is pure water (DIW: deionized water). The rinse liquid supplied to the lower surface nozzle 15 is not limited to pure water, and may be any one of IPA (isopropyl alcohol), carbonated water, electrolytic ion water, hydrogen water, ozone water and a hydrochloric acid water of a dilute concentration (for example, about 1 to 100 ppm).

Although not shown, the lower rinse liquid valve 17 includes a valve body provided with an internal flow path where the liquid flows and an annular valve seat surrounding the internal flow path, a valve member which is movable with respect to the valve seat and an actuator which moves the valve member between a closed position where the valve member contacts the valve seat and an opened position where the valve member is separated from the valve seat. The same applies to other valves. The actuator may be a pneumatic actuator or an electric actuator or an actuator other than those. The controller 3 controls the actuator so as to open and close the lower rinse liquid valve 17.

The outer circumferential surface of the lower surface nozzle 15 and the inner circumferential surface of the spin base 12 defines a lower tubular path 19 which extends vertically. The lower tubular path 19 includes a lower central opening 18 which is open in the central portion of the upper surface 12u of the spin base 12. The lower central opening 18 is arranged below the nozzle disc portion of the lower surface nozzle 15. The substrate processing apparatus 1 includes a lower gas piping 20 which guides an inert gas supplied via the lower tubular path 19 to the lower central opening 18, a lower gas valve 21 which is interposed in the lower gas piping 20 and a lower gas flow rate adjusting valve 22 which changes the flow rate of the inert gas supplied from the lower gas piping 20 to the lower tubular path 19.

The inert gas supplied from the lower gas piping 20 to the lower tubular path 19 is nitrogen gas. The inert gas is not limited to nitrogen gas, and may be another inert gas such as helium gas or argon gas. These inert gases are low oxygen gases which have an oxygen concentration lower than an oxygen concentration (about 21% of the volume) in air.

When the lower gas valve 21 is opened, the nitrogen gas supplied from the lower gas piping 20 to the lower tubular path 19 is discharged upward from the lower central opening 18 at a flow rate corresponding to the degree of opening of the lower gas flow rate adjusting valve 22. Thereafter, the nitrogen gas flows radially in all directions between the lower surface of the substrate W and the upper surface 12u of the spin base 12. Thus, the space between the substrate W and the spin base 12 is filled with the nitrogen gas, and thus an oxygen concentration in an atmosphere is reduced. The oxygen concentration in the space between the substrate W and the spin base 12 is changed according to the degree of opening of the lower gas valve 21 and the lower gas flow rate adjusting valve 22.

The processing cup 23 includes a plurality of guards 25 which receive the liquid discharged outward from the substrate W, a plurality of cups 26 which receive the liquid guided downward by the guards 25 and a cylindrical outer wall member 24 which surrounds the guards 25 and the cups 26. FIG. 3 shows an example where two guards 25 and two cups 26 are provided.

The guard 25 includes a cylindrical guard tubular portion 25b which surrounds the spin chuck 10 and an annular guard ceiling portion 25a which extends obliquely upward from the upper end portion of the guard tubular portion 25b toward the rotation axis A1. Guard ceiling portions 25a vertically overlap each other, and guard tubular portions 25b are arranged concentrically. The cups 26 are arranged below the guard tubular portions 25b, respectively. The cup 26 defines an annular liquid receiving groove which is open upward.

The processing unit 2 includes a guard raising/lowering unit 27 which individually raises and lowers the guards 25. The guard raising/lowering unit 27 locates the guard 25 in an arbitrary position from an upper position to a lower position. The upper position is the position in which the upper end 25u of the guard 25 is arranged higher than a holding position in which the substrate W held by the spin chuck 10 is arranged. The lower position is the position in which the upper end 25u of the guard 25 is arranged lower than the holding position. The annular upper end of the guard ceiling portion 25a corresponds to the upper end 25u of the guard 25. The upper end 25u of the guard 25 surrounds the substrate W and the spin base 12 in plan view.

When the processing liquid is supplied to the substrate W in a state where the spin chuck 10 rotates the substrate W, the processing liquid supplied to the substrate W is spun off around the substrate W. When the processing liquid is supplied to the substrate W, at least one of the upper ends 25u of the guards 25 is arranged higher than the substrate W. Hence, the processing liquid such as the chemical liquid or the rinse liquid which is discharged around the substrate W is received by any one of the guards 25 and guided to the cup 26 corresponding to this guard 25.

As shown in FIG. 4, the processing unit 2 includes the raising/lowering frame 32 which is arranged above the spin chuck 10, the shielding member 33 which is suspended from the raising/lowering frame 32, a center nozzle 45 which is inserted into the shielding member 33 and a shielding member raising/lowering unit 31 which raises and lowers the raising/lowering frame 32 so as to raise and lower the shielding member 33 and the center nozzle 45. The raising/lowering frame 32, the shielding member 33 and the center nozzle 45 are arranged below the rectifying plate 8.

The shielding member 33 includes a disc portion 36 which is arranged above the spin chuck 10 and a tubular portion 37 which extends downward from the outer circumferential portion of the disc portion 36. The shielding member 33 includes an inner surface which has a cup-shaped configuration that is concave upward. The inner surface of the shielding member 33 includes a lower surface 36L of the disc portion 36 and the inner circumferential surface 37i of the tubular portion 37. In the following description, the lower surface 36L of the disc portion 36 may also be referred to as the lower surface 36L of the shielding member 33.

The lower surface 36L of the disc portion 36 is an opposed surface which faces the upper surface of the substrate W. The lower surface 36L of the disc portion 36 is parallel to the upper surface of the substrate W. The inner circumferential surface 37i of the tubular portion 37 extends downward from the outer circumferential edge of the lower surface 36L of the lower surface 36L. The inside diameter of the tubular portion 37 is increased as the lower end of the inner circumferential surface 37i is approached. The inside diameter of the lower end of the inner circumferential surface 37i of the tubular portion 37 is larger than the diameter of the substrate W. The inside diameter of the lower end of the inner circumferential surface 37i of the tubular portion 37 may be larger than the outside diameter of the spin base 12. When the shielding member 33 is arranged in the lower position (position shown in FIG. 3) which will be described below, the substrate W is surrounded by the inner circumferential surface 37i of the tubular portion 37.

The lower surface 36L of the disc portion 36 has a circular ring shaped configuration which surrounds the rotation axis A1. The inner circumferential edge of the lower surface 36L of the disc portion 36 defines an upper central opening 38 which is open in the central portion of the lower surface 36L of the disc portion 36. The inner circumferential surface of the shielding member 33 defines a through hole which extends upward from the upper central opening 38. The through hole of the shielding member 33 vertically penetrates the shielding member 33. The center nozzle 45 is inserted into the through hole of the shielding member 33. The outside diameter of the lower end of the center nozzle 45 is smaller than the diameter of the upper central opening 38.

The inner circumferential surface of the shielding member 33 is coaxial with the outer circumferential surface of the center nozzle 45. The inner circumferential surface of the shielding member 33 surrounds the outer circumferential surface of the center nozzle 45 across an interval in a radial direction (direction orthogonal to the rotation axis A1). The inner circumferential surface of the shielding member 33 and the outer circumferential surface of the center nozzle 45 define an upper tubular path 39 which extends vertically. The center nozzle 45 protrudes upward from the raising/lowering frame 32 and the shielding member 33. When the shielding member 33 is suspended from the raising/lowering frame 32, the lower end of the center nozzle 45 is arranged higher than the lower surface 36L of the disc portion 36. The processing liquid such as the chemical liquid or the rinse liquid is discharged downward from the lower end of the center nozzle 45.

The shielding member 33 includes a tubular connection portion 35 which extends upward from the disc portion 36, and an annular flange portion 34 which extends outward from the upper end portion of the connection portion 35. The flange portion 34 is arranged higher than the disc portion 36 and the tubular portion 37 of the shielding member 33. The flange portion 34 is parallel to the disc portion 36. The outside diameter of the flange portion 34 is smaller than that of the tubular portion 37. The flange portion 34 is supported on the lower plate 32L of the raising/lowering frame 32 which will be described below.

The raising/lowering frame 32 includes an upper plate 32u which is positioned higher than the flange portion 34 of the shielding member 33, a side ring 32s which extends downward from the upper plate 32u and surrounds the flange portion 34, and an annular lower plate 32L which extends inward from the lower end portion of the side ring 32s and is located below the flange portion 34 of the shielding member 33. The outer circumferential portion of the flange portion 34 is arranged between the upper plate 32u and the lower plate 32L. The outer circumferential portion of the flange portion 34 is movable vertically in a space between the upper plate 32u and the lower plate 32L.

The raising/lowering frame 32 and the shielding member 33 include locating protrusions 41 and locating holes 42 which restrict the relative movement of the raising/lowering frame 32 and the shielding member 33 in a circumferential direction (direction around the rotation axis A1) in a state where the shielding member 33 is supported by the raising/lowering frame 32. FIG. 3 shows an example where a plurality of locating protrusions 41 are provided on the lower plate 32L and where a plurality of locating holes 42 are provided in the flange portion 34. The locating protrusions 41 may be provided on the flange portion 34, and the locating holes 42 may be provided in the lower plate 32L.

The locating protrusions 41 are arranged on a circle which has a center arranged on the rotation axis A1. Similarly, the locating holes 42 are arranged on a circle which has a center arranged on the rotation axis A1. The locating holes 42 are arranged in the circumferential direction with the same regularity as the locating protrusions 41. The locating protrusions 41 which protrude upward from the upper surface of the lower plate 32L are inserted into the locating holes 42 which extend upward from the lower surface of the flange portion 34. Thus, the movement of the shielding member 33 in the circumferential direction with respect to the raising/lowering frame 32 is restricted.

The shielding member 33 includes a plurality of upper support portions 43 which protrude downward from the inner surface of the shielding member 33. The spin chuck 10 includes a plurality of lower support portions 44 which supports the upper support portions 43, respectively. The upper support portions 43 are surrounded by the tubular portion 37 of the shielding member 33. The lower ends of the upper support portions 43 are arranged higher than the lower end of the tubular portion 37. The distance in the radial direction from the rotation axis A1 to the upper support portion 43 is larger than the radius of the substrate W. Similarly, the distance in the radial direction from the rotation axis A1 to the lower support portion 44 is larger than the radius of the substrate W. The lower support portions 44 protrude upward from the upper surface 12u of the spin base 12. The lower support portions 44 are arranged on the outer side with respect to the chuck pins 11.

The upper support portions 43 are arranged on a circle which has a center arranged on the rotation axis A1. Similarly, the lower support portions 44 are arranged on a circle which has a center arranged on the rotation axis A1. The lower support portions 44 are arranged in the circumferential direction with the same regularity as the upper support portions 43. The lower support portions 44 are rotated together with the spin base 12 around the rotation axis A1. The rotational angle of the spin base 12 is changed by the spin motor 14. When the spin base 12 is arranged at a reference rotational angle, the upper support portions 43 respectively overlap the lower support portions 44 in plan view.

The shielding member raising/lowering unit 31 is coupled to the raising/lowering frame 32. When the shielding member raising/lowering unit 31 lowers the raising/lowering frame 32 in a state where the flange portion 34 of the shielding member 33 is supported on the lower plate 32L of the raising/lowering frame 32, the shielding member 33 is also lowered. When the shielding member raising/lowering unit 31 lowers the shielding member 33 in a state where the spin base 12 is arranged at such a reference rotational angle that the upper support portions 43 respectively overlap the lower support portions 44 in plan view, the lower end portions of the upper support portions contact the upper end portions of the lower support portions 44. Thus, the upper support portions 43 are respectively supported on the lower support portions 44.

When the shielding member raising/lowering unit 31 lowers the raising/lowering frame 32 after the upper support portions 43 of the shielding member 33 contact the lower support portions 44 of the spin chuck 10, the lower plate 32L of the raising/lowering frame 32 is moved downward with respect to the flange portion 34 of the shielding member 33. Thus, the lower plate 32L is separated from the flange portion 34, and thus the locating protrusions 41 are removed from the locating holes 42. Furthermore, the raising/lowering frame 32 and the center nozzle 45 are moved downward with respect to the shielding member 33, and thus the difference in height between the lower end of the center nozzle 45 and the lower surface 36L of the disc portion 36 of the shielding member 33 is reduced. Here, the raising/lowering frame 32 is arranged at such a height (the lower position which will be described below) that the flange portion 34 of the shielding member 33 does not contact the upper plate 32u of the raising/lowering frame 32.

The shielding member raising/lowering unit 31 locates the raising/lowering frame 32 in an arbitrary position from the upper position (position shown in FIG. 4) to the lower position (position shown in FIG. 3). The upper position is the position in which the locating protrusions 41 are inserted into the locating holes 42 and in which the flange portion 34 of the shielding member 33 contact the lower plate 32L of the raising/lowering frame 32. In other words, the upper position is the position in which the shielding member 33 is suspended from the raising/lowering frame 32. The lower position is the position in which the lower plate 32L is separated from the flange portion 34 and in which the locating protrusions 41 are removed from the locating holes 42. In other words, the lower position is the position in which the coupling of the raising/lowering frame 32 and the shielding member 33 is released and in which the shielding member 33 does not contact any portion of the raising/lowering frame 32.

When the raising/lowering frame 32 and the shielding member 33 are moved to the lower position, the lower ends of the tubular portion 37 of the shielding member 33 are arranged lower than the lower surface of the substrate W, and thus the space between the upper surface of the substrate W and the lower surface 36L of the shielding member 33 is surrounded by the tubular portion 37 of the shielding member 33. Hence, the space between the upper surface of the substrate W and the lower surface 36L of the shielding member 33 is shielded not only from an atmosphere above the shielding member 33 but also from an atmosphere around the shielding member 33. Thus, it is possible to enhance the sealing performance to seal the space between the upper surface of the substrate W and the lower surface 36L of the shielding member 33.

Furthermore, when the raising/lowering frame 32 and the shielding member 33 are arranged in the lower position, even if the shielding member 33 is rotated around the rotation axis A1, the shielding member 33 is prevented from colliding with the raising/lowering frame 32. When the upper support portions 43 of the shielding member 33 are supported on the lower support portions 44 of the spin chuck 10, the upper support portions 43 and the lower support portions 44 engage with each other, and thus the relative movement of the upper support portions 43 and the lower support portions 44 in the circumferential direction is prevented. When the spin motor 14 rotates in this state, the torque of the spin motor 14 is transmitted to the shielding member 33 via the upper support portions 43 and the lower support portions 44. Thus, the shielding member 33 rotates in the same direction and at the same speed as the spin base 12 in a state where the raising/lowering frame 32 and the center nozzle 45 are stationary.

The center nozzle 45 includes a plurality of liquid discharge ports through which the liquid is discharged and a gas discharge port through which the gas is discharged. The liquid discharge ports include a first chemical liquid discharge port 46 through which a first chemical liquid is discharged, a second chemical liquid discharge port 47 through which a second chemical liquid is discharged and an upper rinse liquid discharge port 48 through which the rinse liquid is discharged. The gas discharge port is an upper gas discharge port 49 through which an inert gas is discharged. The first chemical liquid discharge port 46, the second chemical liquid discharge port 47, the upper rinse liquid discharge port 48 are open in the lower end of the center nozzle 45. The upper gas discharge port 49 is open in the outer circumferential surface of the center nozzle 45.

Each of the first chemical liquid and the second chemical liquid is a liquid which contains at least one of sulfuric acid, nitric acid, hydrochloric acid, hydrofluoric acid, phosphoric acid, acetic acid, ammonia water, hydrogen peroxide water, organic acids (for example, citric acid, oxalic acid), organic alkalis (for example, TMAH: tetramethylammonium hydroxide), inorganic alkalis (for example, NaOH: sodium hydroxide), a surfactant and a corrosion inhibitor, for example. Sulfuric acid, nitric acid, hydrochloric acid, hydrofluoric acid, phosphoric acid, acetic acid, ammonia water, hydrogen peroxide water, citric acid, oxalic acid, inorganic alkalis and TMAH are etching liquids.

The first chemical liquid and the second chemical liquid may be the same types of chemical liquid or may be different types of chemical liquids. FIG. 3, etc., show an example where the first chemical liquid is DHF (dilute hydrofluoric acid) and where the second chemical liquid is TMAH. Also, FIG. 3, etc., show the example where the rinse liquid supplied to the center nozzle 45 is pure water and where the inert gas supplied to the center nozzle 45 is nitrogen gas. The rinse liquid supplied to the center nozzle 45 may be a rinse liquid other than pure water. The inert gas supplied to the center nozzle 45 may be an inert gas other than nitrogen gas.

The substrate processing apparatus 1 includes a first chemical liquid piping 50 which guides the first chemical liquid to the center nozzle 45, a first chemical liquid valve 51 which is interposed in the first chemical liquid piping 50, a second chemical liquid piping 52 which guides the second chemical liquid to the center nozzle 45, a second chemical liquid valve 53 which is interposed in the second chemical liquid piping 52, an upper rinse liquid piping 54 which guides the rinse liquid to the center nozzle 45 and an upper rinse liquid valve 55 which is interposed in the upper rinse liquid piping 54. The substrate processing apparatus 1 further includes an upper gas piping 56 which guides the gas to the center nozzle 45, an upper gas valve 57 which is interposed in the upper gas piping 56 and an upper gas flow rate adjusting valve 58 which changes the flow rate of the gas supplied from the upper gas piping 56 to the center nozzle 45.

When the first chemical liquid valve 51 is opened, the first chemical liquid is supplied to the center nozzle 45 and is discharged downward from the first chemical liquid discharge port 46 which is open in the lower end of the center nozzle 45. When the second chemical liquid valve 53 is opened, the second chemical liquid is supplied to the center nozzle 45 and is discharged downward from the second chemical liquid discharge port 47 which is open in the lower end of the center nozzle 45. When the upper rinse liquid valve 55 is opened, the rinse liquid is supplied to the center nozzle 45 and is discharged downward from the upper rinse liquid discharge port 48 which is open in the lower end of the center nozzle 45. Thus, the chemical liquid or the rinse liquid is supplied to the upper surface of the substrate W.

When the upper gas valve 57 is opened, the nitrogen gas guided by the upper gas piping 56 is supplied to the center nozzle 45 at a flow rate corresponding to the degree of opening of the upper gas flow rate adjusting valve 58 and is discharged obliquely downward from the upper gas discharge port 49 which is open in the outer circumferential surface of the center nozzle 45. Thereafter, the nitrogen gas flows downward within the upper tubular path 39 while flowing in the circumferential direction within the upper tubular path 39. The nitrogen gas that has reached the lower end of the upper tubular path 39 flows downward from the lower end of the upper tubular path 39. Thereafter, the nitrogen gas flows radially in all directions in the space between the upper surface of the substrate W and the lower surface 36L of the shielding member 33. Thus, the space between the substrate W and the shielding member 33 is filled with the nitrogen gas, and the oxygen concentration in the atmosphere is reduced. The oxygen concentration in the space between the substrate W and the shielding member 33 is changed according to the degree of opening of the upper gas valve 57 and the upper gas flow rate adjusting valve 58.

Figure 5:
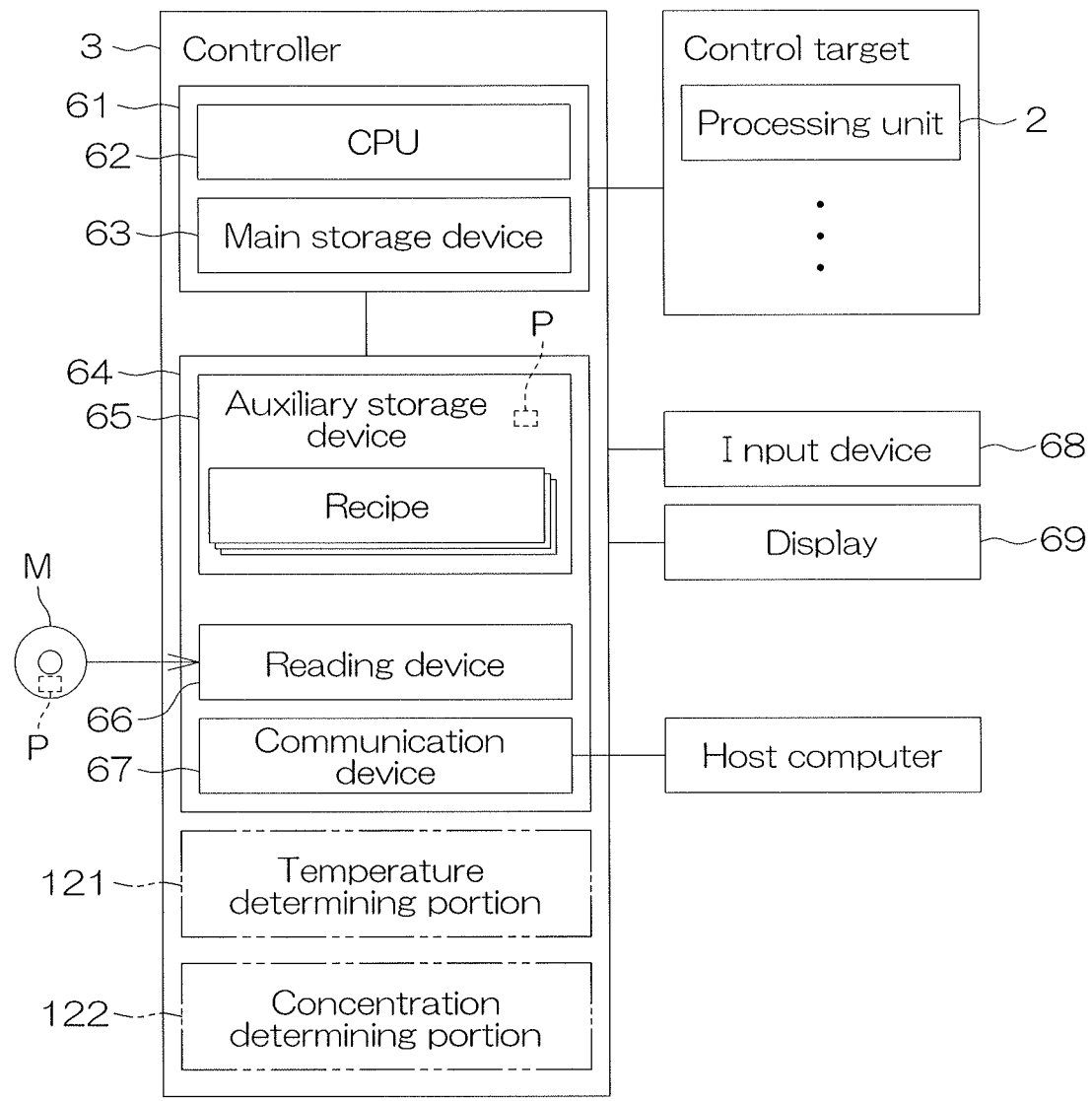
FIG. 5 is a block diagram showing the hardware and the functional blocks of a controller.

FIG. 5 is a block diagram showing the hardware and the functional blocks of the controller 3. A temperature determining portion 121 and a concentration determining portion 122 shown in FIG. 5 will be described in a second preferred embodiment and a third preferred embodiment. The temperature determining portion 121 and the concentration determining portion 122 are functional blocks which are realized by causing the CPU to execute the program installed in the controller 3.

The controller 3 is a computer which includes a computer main body 61 and a peripheral device 64 which is connected to the computer main body 61. The computer main body 61 includes a CPU 62 (central processing unit) which executes various types of commands and a main storage device 63 which stores information. The peripheral device 64 includes an auxiliary storage device 65 which stores information such as a program P, a reading device 66 which reads information from a removable medium M and a communication device 67 which communicates with other devices such as a host computer.

The controller 3 is connected to an input device 68 and a display 69. The input device 68 is operated when an operator such as a user or a maintenance operator inputs information to the substrate processing apparatus 1. The information is displayed on the screen of the display 69. The input device 68 may be any one of a keyboard, a pointing device and a touch panel or may be a device other than those. A touch panel display which serves both as the input device 68 and the display 69 may be provided in the substrate processing apparatus 1.

The CPU 62 executes the program P stored in the auxiliary storage device 65. The program P within the auxiliary storage device 65 may be previously installed in the controller 3, may be fed through the reading device 66 from the removable medium M to the auxiliary storage device 65 or may be fed from an external device such as the host computer to the auxiliary storage device 65 through the communication device 67.

The auxiliary storage device 65 and the removable medium M are nonvolatile memories which retain memory even without power being supplied. The auxiliary storage device 65 is, for example, a magnetic storage device such as a hard disk drive. The removable medium M is, for example, an optical disc such as a compact disc or a semiconductor memory such as a memory card. The removable medium M is an example of a computer readable recording medium in which the program P is recorded.

The auxiliary storage device 65 stores a plurality of recipes. The recipe is information which specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed according to the recipe designated by the host computer. The controller 3 executes individual steps described below by controlling the substrate processing apparatus 1. In other words, the controller 3 is programmed to execute the individual steps described below.

Figure 6:
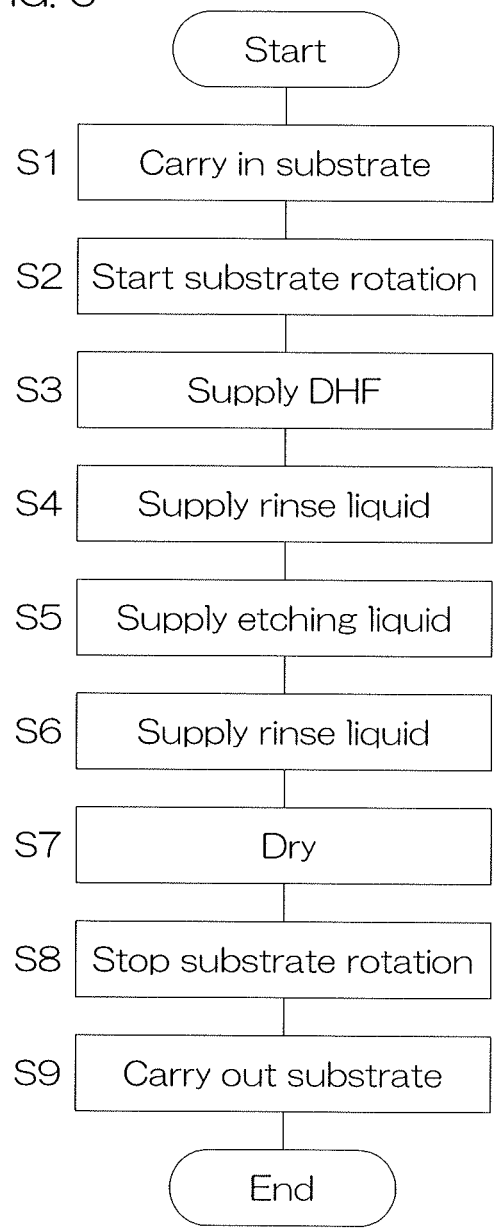
FIG. 6 is a process chart for describing an example of the processing of the substrate which is executed by the substrate processing apparatus.

FIG. 6 is a process chart for describing an example of the processing of the substrate W which is executed by the substrate processing apparatus 1. In the following description, FIGS. 1 to 4 and 6 are referred to.

A specific example of the processing of the substrate W is etching processing in which TMAH as an example of an etching liquid is supplied to the front surface of the substrate W (silicon wafer) on which a polysilicon film is exposed so as to etch the polysilicon film. A target to be etched may be a thin film other than the polysilicon film or the substrate W itself (silicon wafer). Processing other than the etching may be executed.

When the substrate W is processed by the substrate processing apparatus 1, a carry-in step of carrying the substrate W into the chamber 4 is performed (step S1 in FIG. 6).

Specifically, in a state where the raising/lowering frame 32 and the shielding member 33 are positioned in the upper position and where all the guards 25 are positioned in the lower position, the center robot CR causes the hand H1 to enter the chamber 4 while supporting the substrate W with the hand H1. Then, the center robot CR places, on the chuck pins 11, the substrate W on the hand H1 with the front surface of the substrate W directed upward. Thereafter, the chuck pins 11 are pressed onto the outer circumferential surface of the substrate W, and thus the substrate W is grasped. The center robot CR places the substrate W on the spin chuck 10 and thereafter retracts the hand H1 from the interior of the chamber 4.

Then, the upper gas valve 57 and the lower gas valve 21 are opened, and thus the upper central opening 38 of the shielding member 33 and the lower central opening 18 of the spin base 12 start the discharge of the nitrogen gas. Thus, the oxygen concentration in the atmosphere in contact with the substrate W is reduced. Furthermore, the shielding member raising/lowering unit 31 lowers the raising/lowering frame 32 from the upper position to the lower position, and the guard raising/lowering unit 27 raises any one of the guards 25 from the lower position to the upper position. Here, the spin base 12 is held at such a reference rotational angle where the upper support portions 43 respectively overlap the lower support portions 44 in plan view. Hence, the upper support portions 43 of the shielding member 33 are supported on the lower support portions 44 of the spin base 12, and the shielding member 33 is separated from the raising/lowering frame 32. Thereafter, the spin motor 14 is driven so as to start the rotation of the substrate W (step S2 in FIG. 6).

Then, a first chemical liquid supplying step of supplying DHF as an example of the first chemical liquid to the upper surface of the substrate W is performed (step S3 in FIG. 6).

Specifically, in a state where the shielding member 33 is positioned in the lower position, the first chemical liquid valve 51 is opened, and thus the center nozzle 45 starts the discharge of the DHF. The DHF discharged from the center nozzle 45 lands on the central portion of the upper surface of the substrate W and thereafter flows outward along the upper surface of the substrate W which is being rotated. Thus, a liquid film of the DHF which covers the entire region of the upper surface of the substrate W is formed, and the DHF is supplied to the entire region of the upper surface of the substrate W. When a predetermined time elapses after the opening of the first chemical liquid valve 51, the first chemical liquid valve 51 is closed, and the discharge of the DHF is stopped.

Then, a first rinse liquid supplying step of supplying pure water as an example of the rinse liquid to the upper surface of the substrate W is performed (step S4 in FIG. 6).

Specifically, in a state where the shielding member 33 is positioned in the lower position, the upper rinse liquid valve 55 is opened, and thus the center nozzle 45 starts the discharge of the pure water. The pure water which lands on the central portion of the upper surface of the substrate W flows outward along the upper surface of the substrate W that is being rotated. The DHF on the substrate W is rinsed off by the pure water discharged from the center nozzle 45. Thus, a liquid film of the pure water which covers the entire region of the upper surface of the substrate W is formed. When a predetermined time elapses after the opening of the upper rinse liquid valve 55, the upper rinse liquid valve 55 is closed, and the discharge of the pure water is stopped.

Then, a second chemical liquid supplying step of supplying TMAH as an example of the second chemical liquid to the upper surface of the substrate W is performed (step S5 in FIG. 6).

Specifically, in a state where the shielding member 33 is positioned in the lower position, the second chemical liquid valve 53 is opened, and thus the center nozzle 45 starts the discharge of the TMAH. Before the start of the discharge of the TMAH, in order to switch the guards 25 which receive the liquid discharged from the substrate W, the guard raising/lowering unit 27 may vertically move at least one of the guards 25. The TMAH which lands on the central portion of the upper surface of the substrate W flows outward along the upper surface of the substrate W that is being rotated. The pure water on the substrate W is replaced by the TMAH discharged from the center nozzle 45. Thus, a liquid film of the TMAH which covers the entire region of the upper surface of the substrate W is formed. When a predetermined time elapses after the opening of the second chemical liquid valve 53, the second chemical liquid valve 53 is closed, and the discharge of the TMAH is stopped.

Then, a second rinse liquid supplying step of supplying pure water as an example of the rinse liquid to the upper surface of the substrate W is performed (step S6 in FIG. 6).

Specifically, in the state where the shielding member 33 is positioned in the lower position, the upper rinse liquid valve 55 is opened, and thus the center nozzle 45 starts the discharge of the pure water. The pure water which lands on the central portion of the upper surface of the substrate W flows outward along the upper surface of the substrate W that is being rotated. The TMAH on the substrate W is rinsed off by the pure water discharged from the center nozzle 45. Thus, a liquid film of the pure water which covers the entire region of the upper surface of the substrate W is formed. When a predetermined time elapses after the opening of the upper rinse liquid valve 55, the upper rinse liquid valve 55 is closed, and the discharge of the pure water is stopped.

Then, a drying step of drying the substrate W by the rotation of the substrate W is performed (step S7 in FIG. 6).

Specifically, in the state where the shielding member 33 is positioned in the lower position, the spin motor 14 accelerates the substrate W in the rotation direction so as to rotate the substrate W at a high rotational speed (for example, several thousands of rpm) higher than the rotational speed of the substrate W in a period from the first chemical liquid supplying step to the second rinse liquid supplying step. Thus, the liquid is removed from the substrate W, and thus the substrate W is dried. When a predetermined time elapses after the start of the high-speed rotation of the substrate W, the spin motor 14 stops the rotation. Here, the spin motor 14 stops the spin base 12 at the reference rotational angle. Thus, the rotation of the substrate W is stopped (step S8 in FIG. 6).

Then, a carry-out step of carrying the substrate W out from the chamber 4 is performed (step S9 in FIG. 6).

Specifically, the shielding member raising/lowering unit 31 raises the raising/lowering frame 32 to the upper position, and the guard raising/lowering unit 27 lowers all the guards 25 to the lower position. Furthermore, the upper gas valve 57 and the lower gas valve 21 are closed, and thus the upper central opening 38 of the shielding member 33 and the lower central opening 18 of the spin base 12 stop the discharge of the nitrogen gas. Thereafter, the center robot CR causes the hand H1 to enter the chamber 4. After the chuck pins 11 release the grasping of the substrate W, the center robot CR supports the substrate W on the spin chuck 10 with the hand H1. Thereafter, the center robot CR retracts the hand H1 from the interior of the chamber 4 while supporting the substrate W with the hand H1. Thus, the processed substrate W is carried out from the chamber 4.

Figure 7:
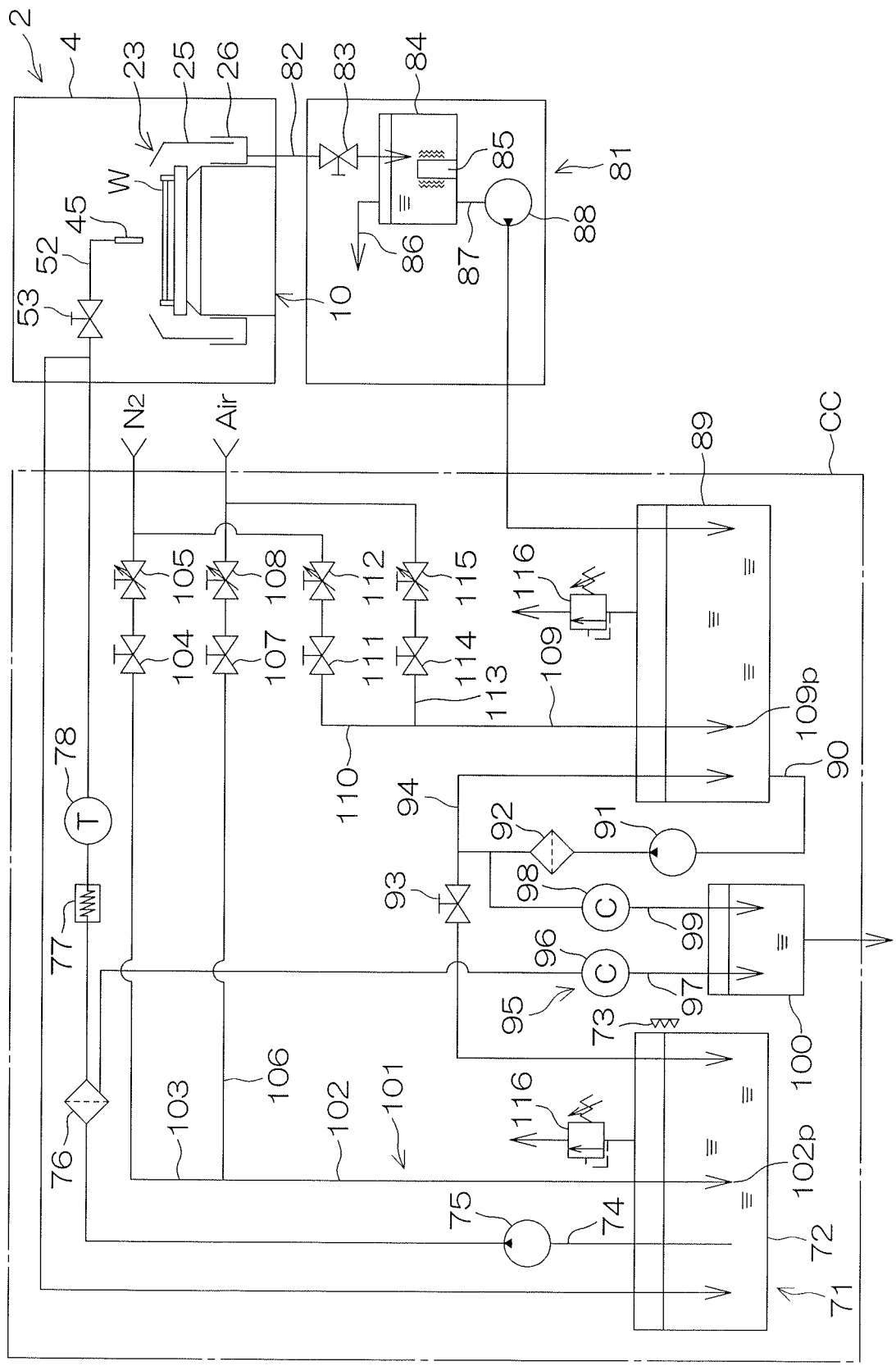
FIG. 7 is a schematic view showing a chemical liquid supplying unit, a chemical liquid collecting unit, a concentration measuring unit and a dissolved oxygen concentration changing unit.

FIG. 7 is a schematic view showing a chemical liquid supplying unit 71, a chemical liquid collecting unit 81, a concentration measuring unit 95 and a dissolved oxygen concentration changing unit. In FIG. 7, alternate long and short dash lines denote the chemical liquid cabinet CC. In FIG. 7 members surrounded by the alternate long and short dash lines are disposed inside the chemical liquid cabinet CC. In the following description, the second chemical liquid is referred to simply as the chemical liquid.

The substrate processing apparatus 1 includes the chemical liquid supplying unit 71 that supplies the chemical liquid to the substrate W and the chemical liquid collecting unit 81 that collects the chemical liquid that has been supplied to the substrate W to the chemical liquid supplying unit 71. The center nozzle 45, the second chemical liquid piping 52 and the second chemical liquid valve 53 are included in the chemical liquid supplying unit 71. The substrate processing apparatus 1 further includes the concentration measuring unit 95 that measures the concentration of gas dissolved in the chemical liquid and the dissolved oxygen concentration changing unit (a gas dissolving unit 101 and a degasifier 85) that changes the dissolved oxygen concentration in the chemical liquid.

The chemical liquid supplying unit 71 includes a supply tank 72 that stores the chemical liquid to be supplied to the substrate W and a liquid surface sensor 73 that detects amount of the chemical liquid in the supply tank 72. The chemical liquid supplying unit 71 further includes a circulation piping 74 that defines an annular circulation path to circulate the chemical liquid in the supply tank 72, a pump 75 that sends the chemical liquid in the supply tank 72 to the circulation piping 74 and a filter 76 that removes foreign matters such as particles from the chemical liquid flowing through the circulation path.

an upstream end and a downstream end of the circulation piping 74 are connected to the supply tank 72. The pump 75 and the filter 76 are interposed into the circulation piping 74. The chemical liquid is sent by the pump 75 from the supply tank 72 to the upstream end of the circulation piping 74 and returns to the supply tank 72 through the downstream end of the circulation piping 74. Thus, the chemical liquid in the supply tank 72 circulates through the circulation path. An upstream end of the second chemical liquid piping 52 is connected to the circulation piping 74. When the second chemical liquid valve 53 is opened, some of the chemical liquid flowing through the circulation piping 74 is supplied to the center nozzle 45 via the second chemical liquid piping 52.

The chemical liquid supplying unit 71 may include a temperature controller 77 that changes the temperature of the chemical liquid in the supply tank 72 by heating or cooling the chemical liquid, and a thermometer 78 that measures the temperature of the chemical liquid the temperature of which is adjusted by the temperature controller 77. The temperature controller 77 and the thermometer 78 are interposed into the circulation piping 74. The temperature of the temperature controller 77 is changed based on the measured values of the thermometer 78. Thus, the temperature of the chemical liquid in the supply tank 72 is kept the preset temperature.

FIG. 7 shows an example in which the temperature controller 77 is a heater that heats liquid at temperature higher than the room temperature (for example, 20 to 30 degrees Celsius) and the thermometer 78 detects the temperature of the chemical liquid in the circulation piping 74. The temperature controller 77 may be a cooler that cools liquid at temperature lower than the room temperature, or may have a function to heat and cool. The temperature controller 77 may be disposed in the supply tank 72. The thermometer 78 may detect the temperature of the chemical liquid in the supply tank 72.

The chemical liquid collecting unit 81 includes an upstream tank 84 that store the chemical liquid collected from the processing unit 2, and a downstream tank 89 that store the chemical liquid collected from the upstream tank 8. The chemical liquid collecting unit 81 further includes an upstream piping 82 that guides the chemical liquid from the processing unit 2 to the upstream tank 84, an intermediate piping 87 that guides the chemical liquid from the upstream tank 84 to the downstream tank 89, and a downstream piping 90 that guides the chemical liquid from the downstream tank 89 to the supply tank 72. Each of the upstream tank 84 and the downstream tank 89 is a collecting tank that temporarily stores the chemical liquid to be collected from the processing unit 2 from the supply tank 72.

FIG. 7 shows an example in which the upstream tank 84 is disposed under the processing unit 2, and the downstream tank 89 is disposed inside the chemical liquid cabinet CC. The upstream tank 84 may be disposed inside the outer wall 1a (refer to FIG. 1) of the substrate processing apparatus 1, or may be disposed outside the outer wall 1a of the substrate processing apparatus 1. The upstream tank 84 may be connected to a plurality of the processing units 2 via the upstream piping 82, or may be connected only to the single processing unit 2 via the upstream piping 82. In the former case, the upstream tank 84 may be connected only to all the processing units 2 included in the same tower, or may be connected to all the processing units 2 included in the substrate processing apparatus 1

The upstream end of the upstream piping 82 is connected to any of the cups 26 of the processing cup 23. The downstream end of the upstream piping 82 is connected to the upstream tank 84. The upstream end of the intermediate piping 87 is connected to the upstream tank 84. The downstream end of the intermediate piping 87 is connected to the downstream tank 89. The chemical liquid collecting unit 81 includes an upstream valve 83 that opens and closes the interior of the upstream piping 82 and an upstream pump 88 that send the chemical liquid in the upstream tank 84 to the downstream tank 89 via the intermediate piping 87.

The chemical liquid that has been supplied to the substrate W flows from the cup 26 connected to the upstream piping 82 to the upstream piping 82. When the upstream valve 83 is open, the chemical liquid in the cup 26 flows into the upstream tank 84 via the upstream piping 82. When the upstream valve 83 is close, the chemical liquid that has flowed into the upstream piping 82 from the cup 26 is blocked by the upstream valve 83. The chemical liquid in the upstream tank 84 is sent by the upstream pump 88 from the upstream tank 84 to the intermediate piping 87, and flows into the downstream tank 89. Thus, the chemical liquid in the upstream tank 84 is collected to the downstream tank 89 via the intermediate piping 87.

The downstream tank 89 is connected to the upstream end of the downstream piping 90. The downstream end of the downstream piping 90 is connected to the supply tank 72. The chemical liquid collecting unit 81 includes a downstream valve 93 that opens and closes the interior of the downstream piping 90. The chemical liquid collecting unit 81 further includes a downstream pump 91 that sends the chemical liquid in the downstream tank 89 to the supply tank 72 via the downstream piping 90, a downstream filter 92 that removes foreign matters from the chemical liquid flowing through the downstream piping 90, and a return piping 94 that guides the chemical liquid in the downstream piping 90 to the downstream tank 89.

The downstream pump 91 and the downstream filter 92 are interposed into the downstream piping 90. The upstream end of the return piping 94 is connected to the downstream piping 90. The downstream end of the return piping 94 is connected to the downstream tank 89. The downstream pump 91 and the downstream filter 92 is disposed upstream of the downstream valve 93. Similarly, the upstream end of the return piping 94 is disposed upstream of the downstream valve 93. The upstream end of the return piping 94 is disposed downstream of the downstream pump 91.

When the downstream valve 93 is open, some of the chemical liquid sent by the downstream pump 91 from the downstream tank 89 to the downstream piping 90 is supplied to the supply tank 72 via the downstream piping 90, and the remaining chemical liquid returns to the downstream tank 89 via the return piping 94. When the downstream valve 93 is close, all of the chemical liquid sent by the downstream pump 91 from the downstream tank 89 to the downstream piping 90 returns to the downstream tank 89 via the return piping 94. Thus, when the downstream valve 93 is close, the chemical liquid in the downstream tank 89 circulates through an annular circulation path defined by the downstream piping 90 and the return piping 94.

The concentration measuring unit 95 includes a first oxygen meter 96 that measures the dissolved oxygen concentration in the chemical liquid in the supply tank 72 and a second oxygen meter 98 that measures the dissolved oxygen concentration in the chemical liquid in the downstream tank 89. FIG. 7 shows an example in which the first oxygen meter 96 and the second oxygen meter 98 measure the dissolved oxygen concentration in the chemical liquid outside the supply tank 72 and the downstream tank 89. In this example, the concentration measuring unit 95 includes a first measuring piping 97 that guides the chemical liquid discharged from the supply tank 72 and a second measuring piping 99 that guides the chemical liquid discharged from the downstream tank 89. The first oxygen meter 96 may measure the dissolved oxygen concentration in the chemical liquid at the interior of the supply tank 72. Similarly, the second oxygen meter 98 may measure the dissolved oxygen concentration in the chemical liquid at the interior of the downstream tank 89.

The first oxygen meter 96 is interposed into the first measuring piping 97. The second oxygen meter 98 is interposed into the second measuring piping 99. The first oxygen meter 96 and the second oxygen meter 98 may be interposed into the circulation piping 74 and the downstream piping 90, respectively. In this case, the first measuring piping 97 and the second measuring piping 99 may be omitted. The upstream end of the first measuring piping 97 is connected to the filter 76. The upstream end of the second measuring piping 99 is connected to the downstream piping 90 at a position upstream of the downstream valve 93. The downstream ends of the first measuring piping 97 and the second measuring piping 99 are connected to a drain tank 100. The upstream end of the first measuring piping 97 may be connected to the circulation piping 74. The upstream end of the second measuring piping 99 may be connected to the downstream filter 92.

The dissolved oxygen concentration changing unit includes the gas dissolving unit 101 that dissolves concentration adjusting gas including inert gas into the chemical liquid and the degasifier 85 that removes the dissolved gas of the chemical liquid. The concentration adjusting gas is gas having the concentration of inert gas higher than the concentration (about 78% of the volume) of nitrogen gas in air. The concentration adjusting gas may be inert gas, or may be mixed gas of inert gas and gas other than that. Hereinafter, an example in which the concentration adjusting gas is nitrogen gas or mixed gas of nitrogen gas and air will be described.

The gas dissolving unit 101 includes a first gas supplying piping 102 that dissolves gas into the chemical liquid in the supply tank 72 by discharging gas at the interior of the supply tank 72 and a second gas supplying piping 109 that dissolves gas into the chemical liquid in the downstream tank 89 by discharging gas at the interior of the downstream tank 89. A first gas discharging port 102p of the first gas supplying piping 102 is disposed in the chemical liquid stored by the supply tank 72. A second gas discharging port 109p of the second gas supplying piping 109 is disposed in the chemical liquid stored by the downstream tank 89. As long as the first gas discharging port 102p is disposed at the interior of the supply tank 72, the first gas discharging port 102p may be disposed above the liquid surface (the surface of the chemical liquid in the supply tank 7). The same applies to the second gas discharging port 109p.

The gas dissolving unit 101 includes a first inert gas piping 103 that guides the inert gas to the first gas supplying piping 102, a first inert gas valve 104 that opens and closes between an open state in which the inert gas flows from the first inert gas piping 103 to the first gas supplying piping 102 and a close state in which the supply of the inert gas from the first inert gas piping 103 to the first gas supplying piping 102 is stopped, and a first inert gas flow rate adjusting valve 105 that changes a flow rate of the inert gas to be supplied from the first inert gas piping 103 to the first gas supplying piping 102.

Similarly, the gas dissolving unit 101 includes a second inert gas piping 110 that guides the inert gas to the second gas supplying piping 109, a second inert gas valve 111 that opens and closes between an open state in which the inert gas flows from the second inert gas piping 110 to the second gas supplying piping 109 and a close state in which the supply of the inert gas from the second inert gas piping 110 to the second gas supplying piping 109 is stopped, and a second inert gas flow rate adjusting valve 112 that changes a flow rate of the inert gas to be supplied from the second inert gas piping 110 to the second gas supplying piping 109.

The gas dissolving unit 101 may include, in addition to the first inert gas piping 103 and so on, an first oxygen containing gas piping 106 that guides oxygen containing gas that contains oxygen such as clean air, etc., to the first gas supplying piping 102, a first oxygen containing gas valve 107 that opens and closes between an open state in which the oxygen containing gas flows from the first oxygen containing gas piping 106 to the first gas supplying piping 102 and a close state in which the supply of the oxygen containing gas from the first oxygen containing gas piping 106 to the first gas supplying piping 102 is stopped, and a first oxygen containing gas flow rate adjusting valve 108 that changes a flow rate of the oxygen containing gas to be supplied from the first oxygen containing gas piping 106 to the first gas supplying piping 102.

Similarly, the gas dissolving unit 101 may include, in addition to the second inert gas piping 110 and so on, a second oxygen containing gas piping 113 that guides oxygen containing gas that contains oxygen such as clean air, etc., to the second gas supplying piping 109, a second oxygen containing gas valve 114 that opens and closes between an open state in which the oxygen containing gas flows from the second oxygen containing gas piping 113 to the second gas supplying piping 109 and a close state in which the supply of the oxygen containing gas from the second oxygen containing gas piping 113 to the second gas supplying piping 109 is stopped, and a second oxygen containing gas flow rate adjusting valve 115 that changes a flow rate of the oxygen containing gas to be supplied from the second oxygen containing gas piping 113 to the second gas supplying piping 109.

When the first inert gas valve 104 is opened, that is, the first inert gas valve 104 is switched from the close state to the open state, the nitrogen gas, which is an example of the inert gas, is discharged from the first gas discharging port 102p at a flow rate corresponding to the degree of opening of the first inert gas flow rate adjusting valve 105. Thus, a large number of bubbles are formed in the chemical liquid in the supply tank 72, and the nitrogen gas is dissolved in the chemical liquid in the supply tank 72. Here, the dissolved oxygen is removed from the chemical liquid, and thus the dissolved oxygen concentration of the chemical liquid is lowered.

When the first oxygen containing gas valve is opened, air, which is an example of the oxygen containing gas, is discharged from the first gas discharging port 102p at a flow rate corresponding to the degree of opening of the first oxygen containing gas flow rate adjusting valve 108. Thus, a large number of bubbles are formed in the chemical liquid in the supply tank 72, and the air is dissolved in the chemical liquid in the supply tank 72. Air contains oxygen at about 21% of the volume, whereas the nitrogen gas does not contain oxygen or contains only a very small amount of oxygen. Hence, as compared with a case where the air is not supplied into the supply tank 72, it is possible to increase the dissolved oxygen concentration of the chemical liquid within the supply tank 72 in a short time.

Similarly, when the second inert gas valve 111 is opened, the nitrogen gas is supplied into the downstream tank 89 and dissolves in the chemical liquid in the downstream tank 89. When the second oxygen containing gas valve 11 is opened, air is supplied into the downstream tank 89 and dissolves in the chemical liquid in the downstream tank 89. Thus, the dissolved oxygen concentration of the chemical liquid in the downstream tank 89 is adjusted. The dissolved oxygen concentration of the chemical liquid in the downstream tank 89 is changed according to the degree of opening of the second inert gas flow rate adjusting valve 112 and the second oxygen containing gas flow rate adjusting valve 115.

The controller 3 may constantly supply the concentration adjusting gas (nitrogen gas or mixed gas of nitrogen and air) into the supply tank 72, or may supply the concentration adjusting gas into the supply tank 72 only when necessary. Similarly, the controller 3 may constantly supply the concentration adjusting gas into the downstream tank 8, or may supply the concentration adjusting gas into the downstream tank 8 only when necessary. The controller 3 maintains the dissolved oxygen concentration of the chemical liquid in the supply tank 72 at a value within the final target concentration range by changing the flow rate and the composition of the concentration adjusting gas based on the measured values of the first oxygen meter 96. The controller 3 may maintain the dissolved oxygen concentration of the chemical liquid in the downstream tank 89 at a value within the intermediate target concentration range by changing the flow rate and the composition of the concentration adjusting gas based on the measured values of the second oxygen meter 98.

When the concentration adjusting gas is supplied into the supply tank 72, the gas pressure in the supply tank 72 increases. Similarly, When the concentration adjusting gas is supplied into the downstream tank 89, the gas pressure in the downstream tank 89 increases. When the gas pressure in the supply tank 72 exceeds the upper limit pressure, gas in the supply tank 72 is discharged through a relief valve 116. Similarly, when the gas pressure in the downstream tank 89 exceeds the upper limit pressure, gas in the downstream tank 89 is discharged through a relief valve 116. Thus, the gas pressure in the supply tank 72 and the downstream tank 89 is maintained below the upper limit pressure.

The degasifier 85 of the dissolved oxygen concentration changing unit is an ultrasonic wave generator that generates ultrasonic waves. The ultrasonic wave generator is disposed in the upstream tank 84 and in contact with the chemical liquid in the upstream tank 84. When the ultrasonic wave generator generates ultrasonic waves, bubbles are generated in the chemical liquid in the upstream tank 84. The bubbles are discharged from the surface of the chemical liquid (liquid surface) to a space in the upstream tank 84. Thus, the dissolved gas of the chemical liquid in the upstream tank 84 is removed and the total amount of the gas dissolved in the chemical liquid is decreased the gas discharged from the chemical liquid in the upstream tank 84 is expelled from the upstream tank 84 through a gas expelling piping 86 connected to the upstream tank 84.

Although FIG. 7 shows an example in which the ultrasonic wave generator is disposed in the upstream tank 84, the ultrasonic wave generator may be disposed outside the upstream tank 84. That is, ultrasonic waves generated by the ultrasonic wave generator may be transmitted to the chemical liquid in the upstream tank 84 through the upstream tank 84. The degasifier 85 may include, in addition to or instead of the ultrasonic wave generator, at least one of a decompressor that reduces the gas pressure in the upstream tank 84, a stirring device that stirs the chemical liquid in the upstream tank 84, and a semipermeable membrane through which only the unnecessary gas passes in the chemical liquid.

The chemical liquid that has been supplied to the substrate W in the processing unit 2 is collected to the upstream tank 84. When the chemical liquid is supplied to the substrate W, the chemical liquid and the atmosphere contact with each other. Thus, gas contained in the atmosphere such as oxygen gas is dissolved in the chemical liquid that has been supplied to the substrate, and the dissolved oxygen concentration increases. There is a case where gas generated due to chemical reaction between the substrate and the chemical liquid is also dissolved in the processing liquid. For example, when acid or alkaline etching liquid is used to etch silicon such as silicon single crystal, polysilicon, or amorphous silicon, etc., hydrogen gas is generated. In this case, the chemical liquid the dissolved hydrogen concentration of which has increased is collected to the upstream tank 84.

Each of the first oxygen meter 96 and the second oxygen meter 98 is a diaphragm-type oxygen meter that measures the dissolved oxygen concentration by an electrochemical analytical method (diaphragm-electrode-method), for example. The diaphragm-type oxygen meter measures the dissolved oxygen concentration of an object to be measured by detecting the concentration of oxygen that has passed through a diaphragm. Since a hydrogen molecule is smaller than an oxygen molecule, hydrogen molecules dissolved in the chemical liquid could pass through the diaphragm of the oxygen meter. Carbon dioxide also could pass through the diaphragm. That is, a molecule or an atom whose size is less than or equal to that of an oxygen molecule could pass through the diaphragm of the oxygen meter. These molecules, etc., could degrade the detection precision of the first oxygen meter 96 and the second oxygen meter 98.

As described above, the degasifier 85 removes the dissolved gas in the chemical liquid stored in the upstream tank 84. Thus, the unnecessary gas dissolved in the chemical liquid during the processing of the substrate W is removed from the chemical liquid. In the downstream tank 89, the concentration adjusting gas dissolves in the chemical liquid. If the unnecessary gas remains in the chemical liquid that has been collected to the downstream tank 89, this unnecessary gas is removed from the chemical liquid by the dissolution of the concentration adjusting gas. Thus, the chemical liquid having the extremely low concentration of the unnecessary gas is collected to the supply tank 72. Accordingly, the dissolved oxygen concentration of the chemical liquid in the supply tank 72 is detected with high precision.

Figure 8:
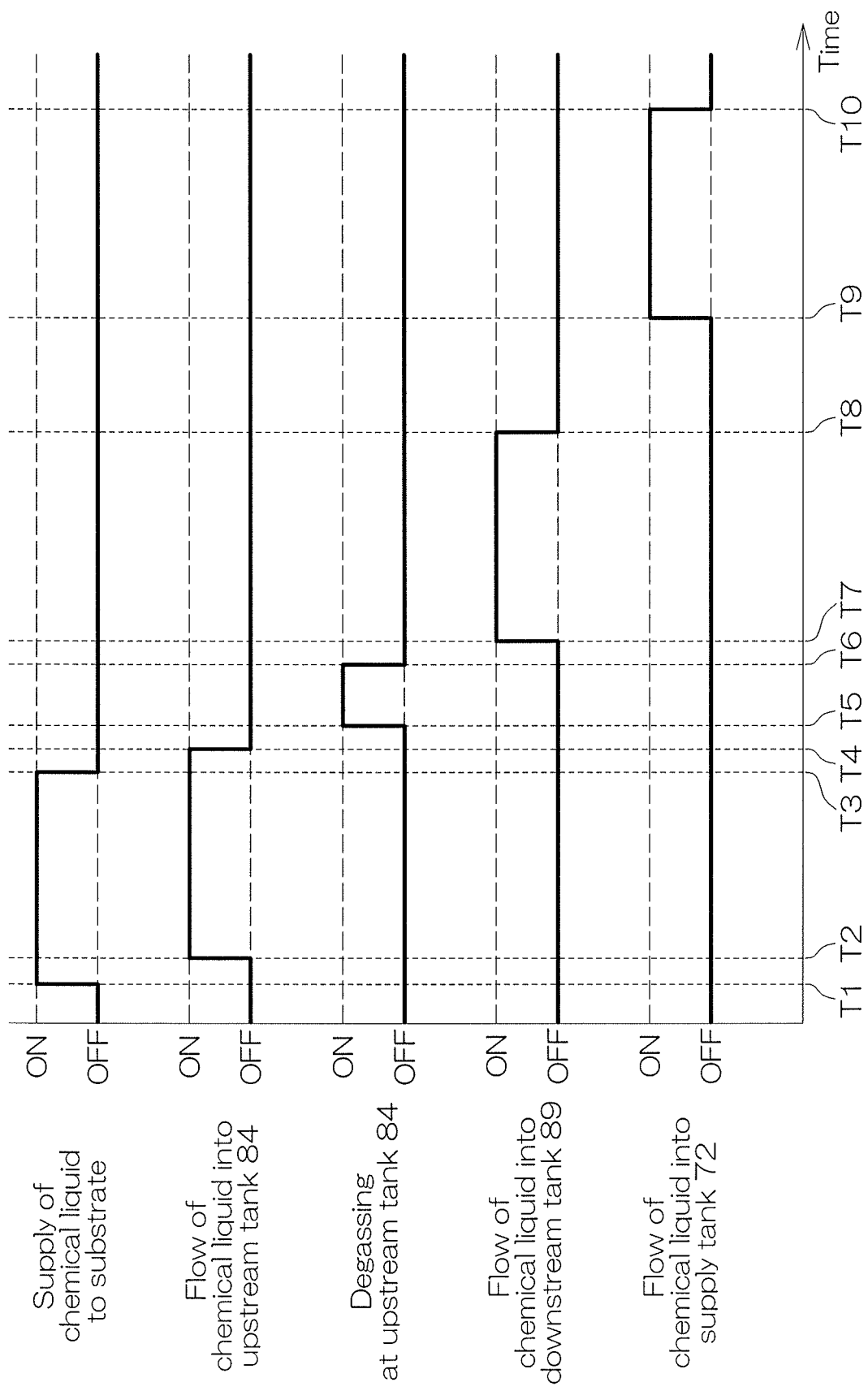
FIG. 8 is a time chart showing operations of the substrate processing apparatus during a period of time from the time when a chemical liquid is supplied to the substrate to the time when the chemical liquid that has been supplied to the substrate is collected to a supply tank.

FIG. 8 is a time chart showing operations of the substrate processing apparatus 1 during a period of time from the time when a chemical liquid is supplied to the substrate W to the time when the chemical liquid that has been supplied to the substrate W is collected to the supply tank 72. The period from Time T1 to Time T2 shown in FIG. 8 is the entirety or a portion of the period in which the above described second chemical liquid supplying step (step S5 in FIG. 6) is performed. Hereinafter, FIG. 7 and FIG. 8 will be referred to.

When the chemical liquid is supplied to the substrate W, the upstream valve 83 (refer to FIG. 7), that switches the collection of the chemical liquid from the processing unit 2 to the upstream tank 84, is opened. After the supply of the chemical liquid to the substrate W is started at Time T1, the collection of the chemical liquid to the upstream tank 84 is started (Time T2). Then, after the supply of the chemical liquid is stopped at Time T3, the collection of the chemical liquid to the upstream tank 84 is completed (Time T4).

The upstream valve 83 is closed after the collection of the chemical liquid to the upstream tank 84 is completed. After that, during the period from Time T5 to Time T6, degassing of the chemical liquid in the upstream tank 84 is performed. Thus, all dissolved gases including the unnecessary gas dissolved in the chemical liquid during the processing of the substrate W are removed from the chemical liquid. Further, since the upstream valve 83 is closed, the dissolved gas that has been removed from the chemical liquid is expelled from the upstream tank 84 through the gas expelling piping 86 without flowing back to the processing unit 2. After the degassing is completed, during the period from Time T7 to Time T8, the chemical liquid in the upstream tank 84 is sent to the downstream tank 89.

During the period from Time T7 to Time T9, the chemical liquid in the downstream tank 89 circulates the circulation path defined by the downstream piping 90 and the return piping 94 without being collected from the downstream tank 89 to the supply tank 72. Also, in this period, the concentration adjusting gas is supplied into the downstream tank 89. Thus, the dissolved oxygen concentration of the chemical liquid in the downstream tank 89 is adjusted. When an amount of the liquid in the supply tank 72 detected by the liquid surface sensor 73 (refer to FIG. 7) falls below the lower limit, the chemical liquid in the downstream tank 89 is sent to the supply tank 72 (from Time T9 to Time T10). Thus, the chemical liquid that has been supplied to the substrate W is collected to the supply tank 72.

During the period after Time T9, the concentration adjusting gas supplied into the supply tank 72 dissolves in the chemical liquid collected to the supply tank 72. The flow rate and the composition of the concentration adjusting gas to be supplied into the supply tank 72 is adjusted based on the measured values of the first oxygen meter 96.

Thus, the dissolved oxygen concentration of the chemical liquid in the supply tank 72 is maintained near the target concentration. Then, the chemical liquid in which the actual dissolved oxygen concentration coincides or almost coincides with the target concentration is supplied to the substrate W again. Thus, the chemical liquid is reused.

Figure 9:
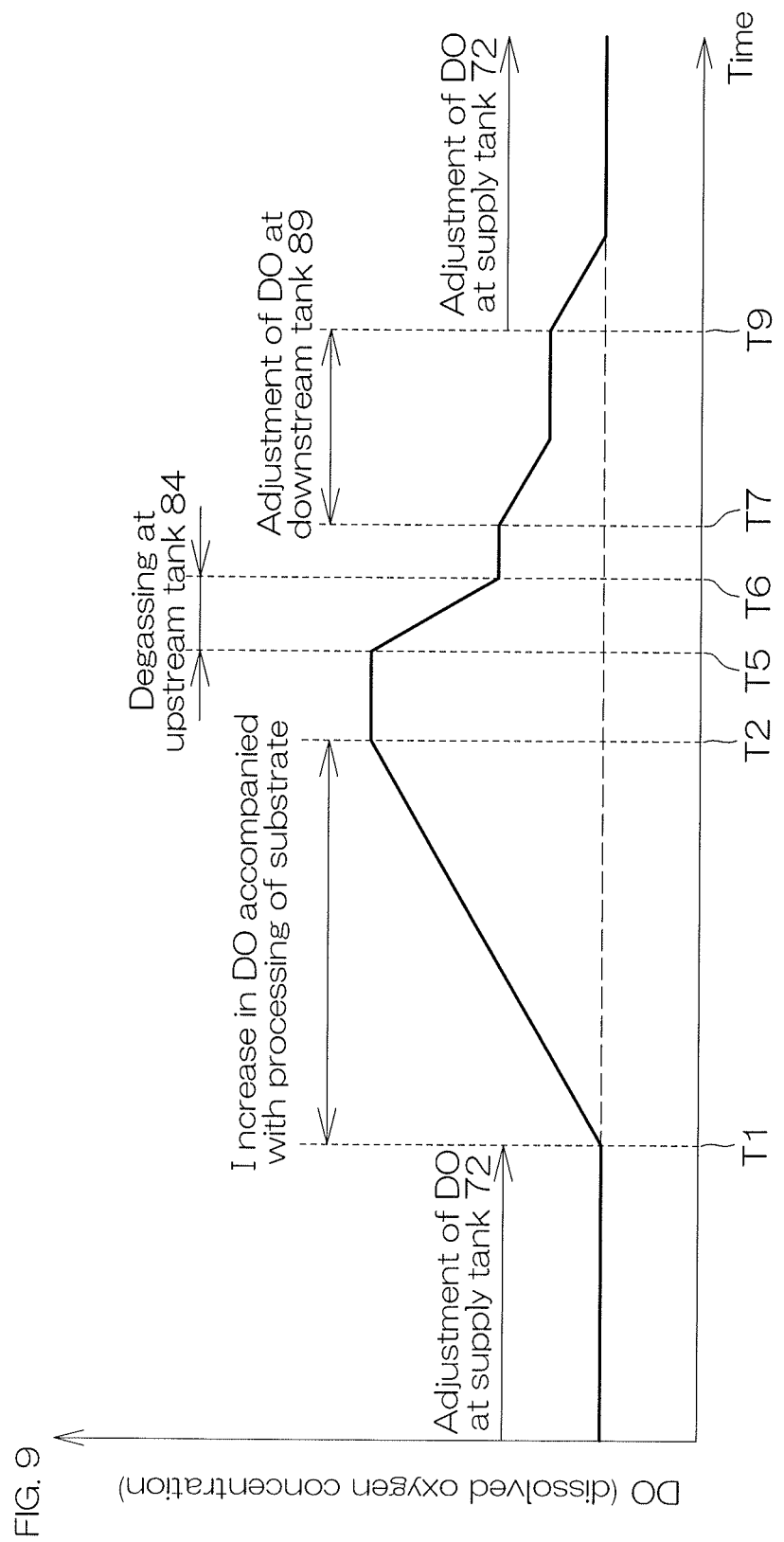
FIG. 9 is a time chart showing an example of schematic temporal change in the dissolved oxygen concentration in the chemical liquid during the period of time shown in FIG. 8.

FIG. 9 is a time chart showing an example of schematic temporal change in the dissolved oxygen concentration in the chemical liquid during the period of time shown in FIG. 8. Hereinafter, FIG. 7 and FIG. 9 will be referred to.

As shown in FIG. 9, the period before Time T1, the dissolved oxygen concentration of the chemical liquid in the supply tank 72 is maintained at the target concentration. During the period from Time T1 to Time T2, oxygen gas, etc., contained in the atmosphere in the processing unit 2 dissolves in the chemical liquid and the dissolved oxygen concentration of the chemical liquid rises over time. During the period from Time 2 to Time 5, the chemical liquid is stored in the upstream tank 84. Thus, during this period, the dissolved oxygen concentration of the chemical liquid does not change significantly.

During the period from Time 5 to Time 6, the degassing of the chemical liquid in the upstream tank 84 being performed. Thus, the dissolved oxygen concentration of the chemical liquid decreases rapidly. Here, not only the oxygen gas but also gas other than that is reduced from the chemical liquid. Thus, not only the dissolved oxygen concentration of the chemical liquid, but also the concentration of the dissolved gas of the chemical liquid decreases rapidly. Further, during the period from Time 7 to Time 9, the concentration adjusting gas supplied into the downstream tank 89 dissolves in the chemical liquid in the downstream tank 89. Thus, the dissolved oxygen concentration of the chemical liquid in the downstream tank 89 is lowered.

FIG. 9 shows an example in which the dissolved oxygen concentration of the chemical liquid in the downstream tank 89 is stable near a constant value (intermediate target concentration) during the period from Time T7 to Time T9. The intermediate target concentration may be higher or lower than the final target concentration. During the period after Time T9, the concentration adjusting gas supplied into the supply tank 72 dissolves in the chemical liquid in the supply tank 72. Thus, the dissolved oxygen concentration of the chemical liquid in the supply tank 72 is stabilized near the constant value (final target concentration). Accordingly, the chemical liquid in which the actual dissolved oxygen concentration coincides or almost coincides with the final target concentration is supplied to the substrate W again.

As described above, in the first preferred embodiment, the dissolved oxygen concentration in the chemical liquid is measured. The concentration adjusting gas having the concentration of inert gas higher than that of air is supplied into the supply tank 72. Thus, the concentration adjusting gas is dissolved in the chemical liquid in the supply tank 72. The flow rate or the composition of the concentration adjusting gas is changed based on the measured values of the dissolved oxygen concentration. Thus, the dissolved oxygen concentration in the chemical liquid is adjusted.

The chemical liquid in the supply tank 72 is supplied to the substrate W. When the chemical liquid is supplied to the substrate W, the chemical liquid and the atmosphere contact with each other. Thus, gas contained in the atmosphere such as oxygen gas is dissolved in the chemical liquid that has been supplied to the substrate W, and the dissolved oxygen concentration increases. There is a case where gas generated due to chemical reaction between the substrate W and the chemical liquid is also dissolved in the chemical liquid. Gas other than the concentration adjusting gas could degrade the detection precision of the first oxygen meter 96 that detects the dissolved oxygen concentration in the chemical liquid.

The unnecessary gas dissolved in the chemical liquid during the processing of the substrate W is decreased before the chemical liquid is collected to the supply tank 72. Thus, even when the chemical liquid in the supply tank 72 contains the chemical liquid that has been supplied to the substrate W, the measurement error of the dissolved oxygen concentration due to the unnecessary gas can be decreased to zero or a small value, and the actual dissolved oxygen concentration of the chemical liquid can be approached to the target concentration. Accordingly, it is possible to process substrates W with extremely stable quality even when reusing the chemical liquid the dissolved oxygen concentration of which is adjusted.

in the first preferred embodiment, the chemical liquid that has been supplied to the substrate W flows into the upstream tank 84, the downstream tank 89 and the supply tank 72 in this order. In the upstream tank 84, all gases including the unnecessary gas are removed from the chemical liquid. In the downstream tank 89, the unnecessary gas dissolved in the chemical liquid is replaced with the concentration adjusting gas. Thus, the supply tank 72 receives the chemical liquid containing an extremely small amount of the unnecessary gas and having the adjusted dissolved oxygen concentration. Accordingly, the dissolved oxygen concentration in the chemical liquid in the supply tank 72 is likely to approach the target concentration in a short time.

Second Preferred Embodiment

Next, the second preferred embodiment will be described. The second preferred embodiment mainly differs from the first preferred embodiment in that it is determined whether or not the removal of the unnecessary gas at the upstream tank 84 is performed in accordance with the temperature of the chemical liquid.

Figure 10:
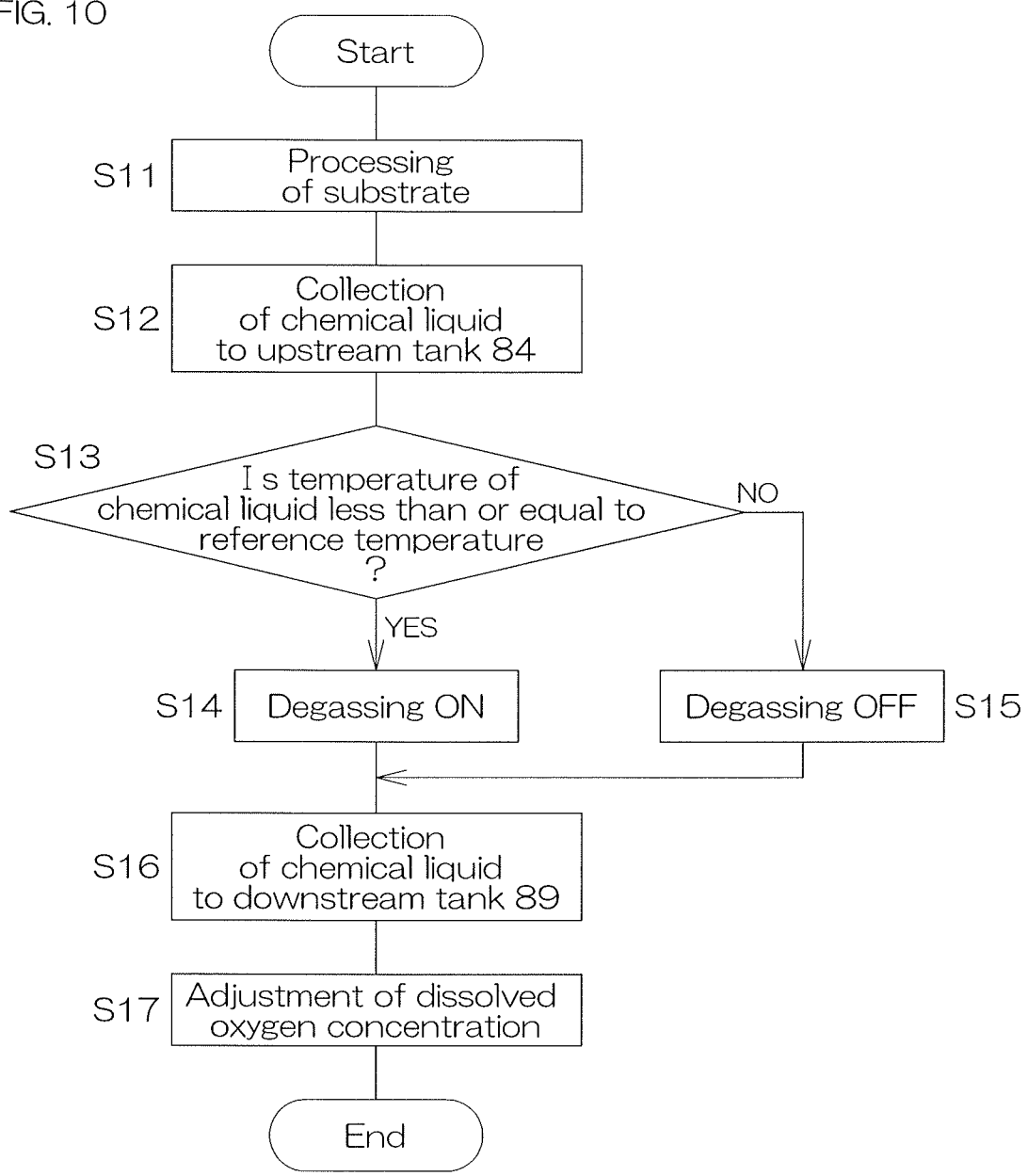
FIG. 10 is a flow chart according to a second preferred embodiment of the present invention showing the flow to determine the removal of the unnecessary gas at an upstream tank should be performed or not.

FIG. 10 is a flow chart according to a second preferred embodiment of the present invention showing the flow to determine the removal of the unnecessary gas at an upstream tank 84 should be performed or not. In FIG. 10, components equivalent to the above described components shown in FIG. 1 to FIG. 9 are designated by the same reference characters as in FIG. 1, etc., and description thereof is omitted.

As shown in FIG. 5, the controller 3 includes the temperature determining portion 121 that determines whether or not the temperature of the chemical liquid in the supply tank 72 is not greater than the reference temperature. The reference temperature is a temperature higher than the room temperature and lower than the boiling point of the chemical liquid. When TMAH which is an example of the chemical liquid is used to etch polysilicon, the reference temperature is 30 to 50 degrees Celsius, for example. Whether or not the temperature of the chemical liquid in the supply tank 72 is not greater than the reference temperature may be determined based on the measured values of the thermometer 78 (refer to FIG. 7) that detects the temperature of the chemical liquid in the supply tank 72, or may be determined based on the preset temperature of the temperature controller 77 (refer to FIG. 7).

As shown in FIG. 10, when the above described second chemical liquid supplying step (step S5 in FIG. 6) is performed (step S11 in FIG. 10), the collection of the chemical liquid to the upstream tank 84 is performed (step S12 in FIG. 10). After that, it is determined Whether or not the temperature of the chemical liquid in the supply tank 72 is not greater than the reference temperature (step S13 in FIG. 10).

When the temperature of the chemical liquid is not greater than the reference temperature (Yes in step 13 in FIG. 10), the degassing is performed at the interior of the upstream tank 84 (step 14 in FIG. 10). After that, the degassed chemical liquid is collected from the upstream tank 84 to the downstream tank 89 (step 16 in FIG. 10). On the other hand, when the temperature of the chemical liquid exceeds the reference temperature (No in step 13 in FIG. 10), the degassing is not performed at the interior of the upstream tank 84 (step 15 in FIG. 10). The chemical liquid to which the degassing is not performed is collected from the upstream tank 84 to the downstream tank 89 (step 16 in FIG. 10).

As described above, in the downstream tank 89, the concentration adjusting gas is dissolved in the chemical liquid. Also in the supply tank 72, the concentration adjusting gas is dissolved in the chemical liquid. Thus, the dissolved oxygen concentration of the chemical liquid that has been supplied to the substrate W is adjusted (step 16 in FIG. 10). Then, the chemical liquid in the supply tank 72 is supplied to other substrate W. Thus, the chemical liquid is reused.

In addition to the actions and effects in the first preferred embodiment, the second preferred embodiment can exhibit actions and effects below. Specifically, in the second preferred embodiment, when the temperature of the chemical liquid is not greater than the reference temperature, the unnecessary gas is removed from the chemical liquid in the collecting tank, and the chemical liquid from which the unnecessary gas has been removed is sent from the collecting tank toward the supply tank 72. On the other hand, when the temperature of the chemical liquid is greater than the reference temperature, the removal of the unnecessary gas is not performed, and the chemical liquid from which the unnecessary gas has not been removed is sent from the collecting tank toward the supply tank 72. That is, it is determined whether or not the removal of the unnecessary gas at the collecting tank is performed in accordance with the temperature of the chemical liquid.

The reactivity of the chemical liquid to the substrate W usually increases as the temperature of the chemical liquid rises. When the temperature of the chemical liquid is high, there is a case where the influence of the temperature is so large that the influence of changes in the dissolved oxygen concentration on quality of processed substrates W can be ignored. In this case, if the temperature of the chemical liquid is precisely controlled, substrates W are processed with extremely stable quality without performing the removal of the unnecessary gas. Thus, a process to collect the chemical liquid that has been supplied to the substrate W into the supply tank 72 can be simplified.

Third Preferred Embodiment

Next, the third preferred embodiment will be described. The third preferred embodiment mainly differs from the first preferred embodiment in that it is determined whether or not the removal of the unnecessary gas at the upstream tank 84 is performed in accordance with the concentration of the unnecessary gas in the chemical liquid.

Figure 11:
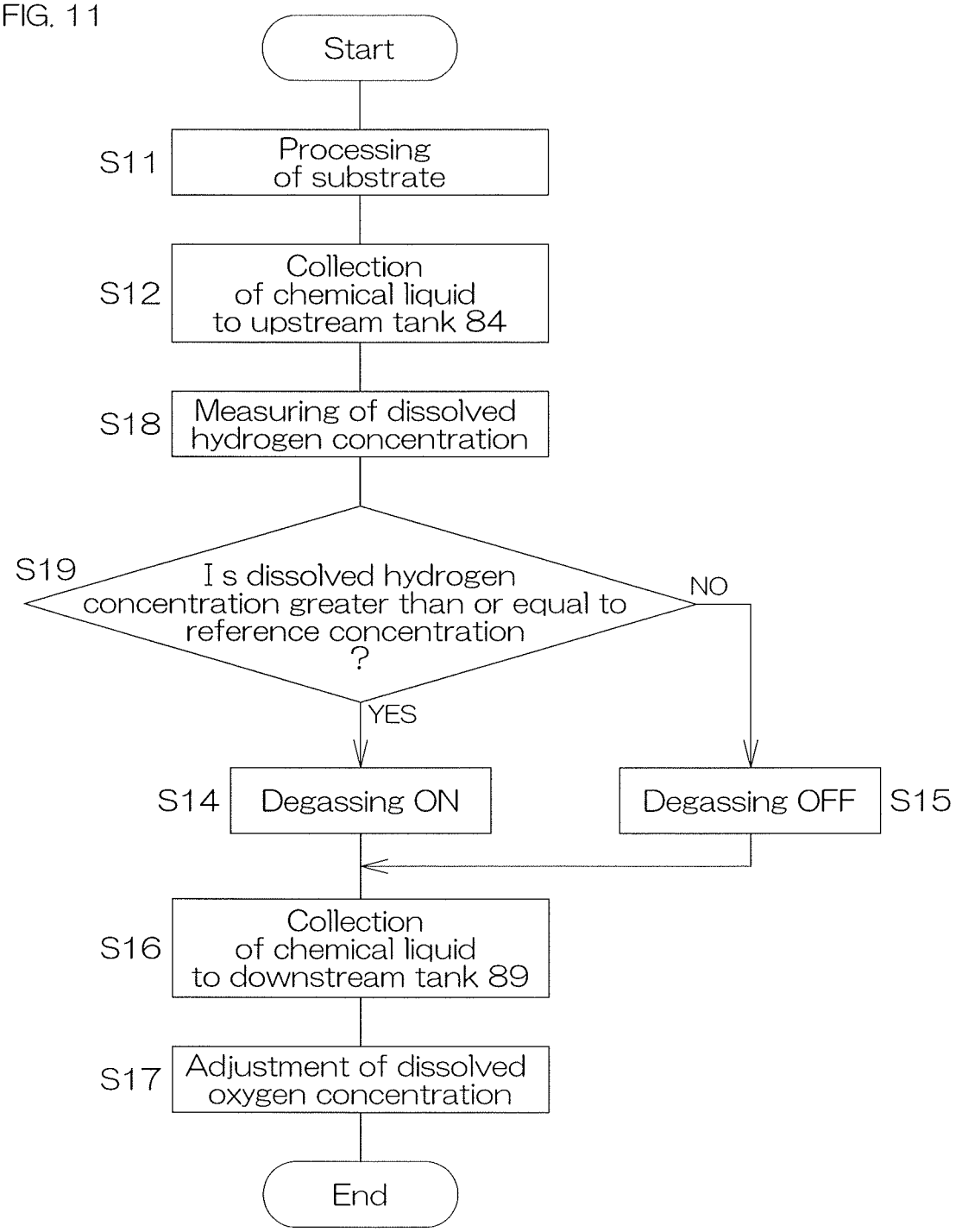
FIG. 11 is a flow chart according to a third preferred embodiment of the present invention showing the flow to determine the removal of the unnecessary gas at an upstream tank should be performed or not.
Figure 12:
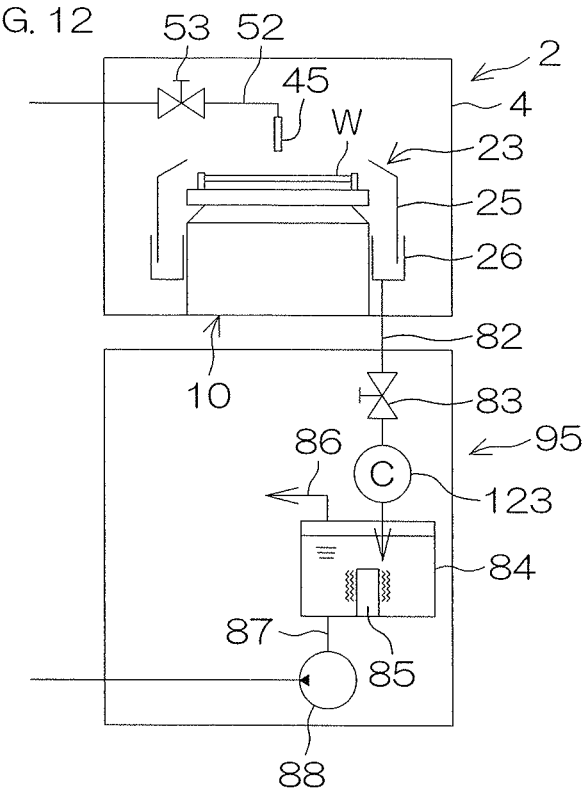
FIG. 12 is a schematic view showing the concentration measuring unit according to the third preferred embodiment of the present invention.

FIG. 11 is a flow chart according to a third preferred embodiment of the present invention showing the flow to determine the removal of the unnecessary gas at an upstream tank 84 should be performed or not. FIG. 12 is a schematic view showing the concentration measuring unit 95 according to the third preferred embodiment of the present invention. In FIG. 11 to FIG. 12, components equivalent to the above described components shown in FIG. 1 to FIG. 10 are designated by the same reference characters as in FIG. 1, etc., and description thereof is omitted.

As shown in FIG. 12, the concentration measuring unit 95 further includes an unnecessary gas meter 123 that measures the concentration of the unnecessary gas in the chemical liquid before the chemical liquid that has been supplied to the substrate W is sent from the upstream tank 84 toward the supply tank 72 (refer to FIG. 7). When TMAH which is an example of the chemical liquid is used to etch polysilicon, the unnecessary gas meter 123 is a hydrogen meter that measures the dissolved hydrogen concentration of the chemical liquid, for example. FIG. 12 shows an example in which the unnecessary gas meter 123 measures the dissolved hydrogen concentration of the chemical liquid in the upstream piping 82. The unnecessary gas meter 123 may measure the dissolved hydrogen concentration of the chemical liquid in the upstream tank 84. As shown in FIG. 5 the controller 3 includes the concentration determining portion 122 that determines whether or not the concentration of the unnecessary gas is not less than the reference concentration based on the measured values of the unnecessary gas meter 123.

As shown in FIG. 11, when the above described second chemical liquid supplying step (step S5 in FIG. 6) is performed (step S11 in FIG. 11), the collection of the chemical liquid to the upstream tank 84 is performed (step S12 in FIG. 11). At this time, the concentration of hydrogen gas which is an example of the unnecessary gas is measured (step S18 in FIG. 11). After that, it is determined Whether or not the concentration of the unnecessary gas in the chemical liquid is not less than the reference concentration.

when the concentration of the unnecessary gas is not less than the reference concentration (Yes in step 18 in FIG. 11), the degassing is performed at the interior of the upstream tank 84 (step 14 in FIG. 11). After that, the degassed chemical liquid is collected from the upstream tank 84 to the downstream tank 89 (step 16 in FIG. 11). On the other hand, when the concentration of the unnecessary gas falls below the reference concentration (No in step 18 in FIG. 11), the degassing is not performed at the interior of the upstream tank 84 (step 15 in FIG. 11). The chemical liquid to which the degassing is not performed is collected from the upstream tank 84 to the downstream tank 89 (step 16 in FIG. 11).

As described above, in the downstream tank 89, the concentration adjusting gas is dissolved in the chemical liquid. Also in the supply tank 72, the concentration adjusting gas is dissolved in the chemical liquid. Thus, the dissolved oxygen concentration of the chemical liquid that has been supplied to the substrate W is adjusted (step 16 in FIG. 11). Then, the chemical liquid in the supply tank 72 is supplied to other substrate W. Thus, the chemical liquid is reused.

In addition to the actions and effects in the first preferred embodiment, the third preferred embodiment can exhibit actions and effects below. Specifically, in the third preferred embodiment, when the concentration of the unnecessary gas in the chemical liquid is not less than the reference concentration, the unnecessary gas is removed from the chemical liquid in the collecting tank, and the chemical liquid from which the unnecessary gas has been removed is sent from the collecting tank toward the supply tank 72. On the other hand, when the concentration of the unnecessary gas in the chemical liquid is less than the reference concentration, the removal of the unnecessary gas is not performed, and the chemical liquid from which the unnecessary gas has not been removed is sent from the collecting tank toward the supply tank 72. That is, it is determined whether or not the removal of the unnecessary gas at the collecting tank is performed in accordance with the concentration of the unnecessary gas. When the concentration of the unnecessary gas in the chemical liquid is low, there is a case where the measurement error of the dissolved oxygen concentration due to the unnecessary gas is negligibly small. In this case, the chemical liquid in which the dissolved oxygen concentration is stable can be supplied to the substrate W without removing the unnecessary gas from the collected chemical liquid.

Fourth Preferred Embodiment

Figure 13:
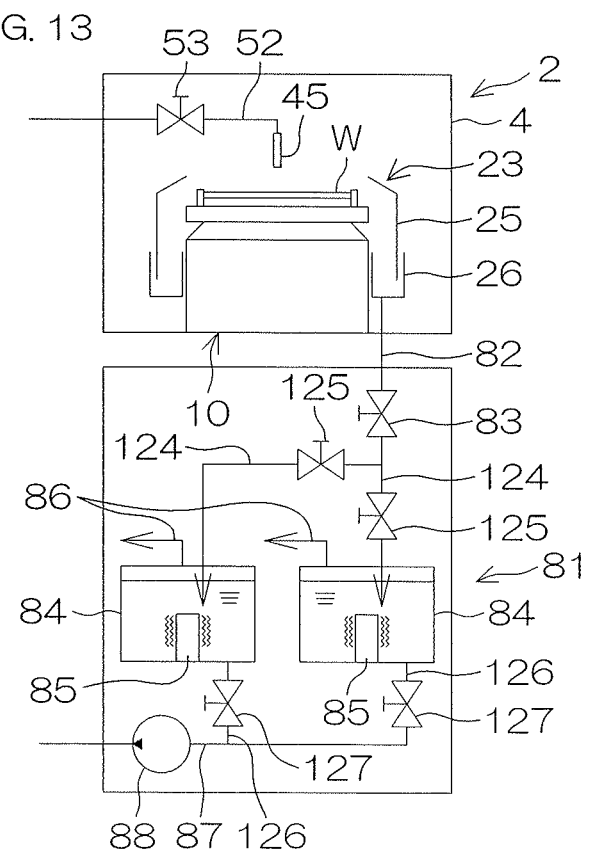
FIG. 13 is a schematic view showing the chemical liquid collecting unit according to a fourth preferred embodiment of the present invention.

Next, a fourth preferred embodiment will be described. The fourth preferred embodiment mainly differs from the first preferred embodiment in that a plurality of the upstream tanks 84 are provided and connected in parallel to each other FIG. 13 is a schematic view showing the chemical liquid collecting unit 81 according to a fourth preferred embodiment of the present invention. In FIG. 13, components equivalent to the above described components shown in FIG. 1 to FIG. 12 are designated by the same reference characters as in FIG. 1, etc., and description thereof is omitted.

The chemical liquid collecting unit 81 includes two upstream tanks 84. The chemical liquid collecting unit 81 further includes two upstream individual pipings 124 that guide the chemical liquid from the upstream piping 82 to the two upstream tanks 84, two upstream individual valves 125 that are interposed into the two upstream individual pipings 124, respectively, two downstream individual pipings 126 that guide the chemical liquid in the upstream tank 84 to the intermediate piping 87, and two downstream individual valves 127 that are interposed into the two downstream individual pipings 126, respectively.

The upstream ends of the two upstream individual pipings 124 are connected to the downstream end of the upstream piping 82. The downstream ends of the two upstream individual pipings 124 are connected to the two upstream tanks 84, respectively. The upstream ends of the two downstream individual pipings 126 are connected to the two upstream tanks 84, respectively. The downstream ends of the two downstream individual pipings 126 are connected to the upstream end of the intermediate piping 87. Thus, the two upstream tanks 84 are connected in parallel to each other.

When the chemical liquid that has been supplied to the substrate W is collected to the upstream tank 84 on the right side in FIG. 13, the upstream individual valve 125 on the right side in FIG. 13 is opened, and the upstream individual valve 125 on the left side in FIG. 13 is closed. When the chemical liquid that has been supplied to the substrate W is collected to the upstream tank 84 on the left side in FIG. 13, the upstream individual valve 125 on the left side in FIG. 13 is opened, and the upstream individual valve 125 on the right side in FIG. 13 is closed. When the chemical liquid in the upstream tank 84 on the right side in FIG. 13 is sent to the intermediate piping 87, the downstream individual valve 127 on the right side in FIG. 13 is opened, and the downstream individual valve 127 on the left side in FIG. 13 is closed. When the chemical liquid in the upstream tank 84 on the left side in FIG. 13 is sent to the intermediate piping 87, the downstream individual valve 127 on the left side in FIG. 13 is opened, and the downstream individual valve 127 on the right side in FIG. 13 is closed.

The upstream valve 83 and the two upstream individual valves 125 corresponds to a collecting switching valve. The collecting switching valve switches between a first collecting state in which the chemical liquid that has been supplied to the substrate W flows into the first upstream tank 84 without flowing into the second upstream tank 84, and a second collecting state in which the chemical liquid that has been supplied to the substrate W flows into the second upstream tank 84 without flowing into the first upstream tank 84. The chemical liquid collecting unit 8 may include, instead of the upstream valve 83 and the two upstream individual valves 125, a three-way valve that is disposed at the connection position in which the upstream piping 82 and the two upstream individual pipings 124 are connected to each other. Similarly, the chemical liquid collecting unit 8 may include, instead of the two downstream individual valves 127, a three-way valve that is disposed at the connection position in which the intermediate piping 87 and the two downstream individual pipings 126 are connected to each other.

In addition to the actions and effects in the first preferred embodiment, the third preferred embodiment can exhibit actions and effects below.

Specifically, in the third preferred embodiment, the controller 3 (refer to FIG. 5) causes the chemical liquid to flow into the first upstream tank 84 without causing the chemical liquid to flow into the second upstream tank 84. At this time, the controller 3 causes the degasifier 85 corresponding to the second upstream tank 84 to remove the dissolved gas. The controller 3 also causes the chemical liquid to flow into the second upstream tank 84 without causing the chemical liquid to flow into the first upstream tank 84. At this time, the controller 3 causes the degasifier 85 corresponding to the first upstream tank 84 to remove the dissolved gas. Thus, the dissolved gas is removed from the chemical liquid stored in one of the two upstream tanks 84 while the chemical liquid that has been supplied to the substrate W flows into the other of the two upstream tanks 84.

In the plurality of the processing units 2, there is a case where the supply of the chemical liquid to the substrates W is performed at different times. In this case, if there is only one upstream tank 84 corresponding to these processing units 2, during the period in which the degassing is performed at the interior of the upstream tank 84 and the collection of the chemical liquid to the upstream tank 84 is stopped, these processing units 2 are unable to supply the chemical liquid to the substrates W. Thus, by providing the plurality of the upstream tanks 84 connected in parallel to each other, any of the processing units 2 is able to supply the chemical liquid to the substrate W even when the dissolved gas is being removed from the chemical liquid.

Other Preferred Embodiments

The present invention is not restricted to the contents of the above described preferred embodiments and various modifications are possible.

For example, the gas dissolving unit 101 may be provided in the upstream tank 84 instead of the degasifier 85. The degasifier 85 may be provided in the upstream tank 84 instead of the gas dissolving unit 101.

At least one of the upstream tank 84 and the downstream tank 89 may be omitted. Or, a collecting tank series-connected to the upstream tank 84 and the downstream tank 89 may be provided. That is, three or more collecting tanks series-connected to each other may be disposed on a collecting path extending from the processing unit 2 to the supply tank 72.

The degassing may be performed at the upstream tank 84 not after the collection of the chemical liquid to the upstream tank 84 from the processing unit 2 is completed, but during the period in which the chemical liquid is being collected to the upstream tank 84 from the processing unit 2.

In the second preferred embodiment, when the temperature of the chemical liquid exceeds the reference temperature, the removal of the unnecessary gas may be omitted at both of the upstream tank 84 and the downstream tank 89, or may be omitted at only the downstream tank 89. Similarly, in the third preferred embodiment, when the concentration of the unnecessary gas dissolved in the chemical liquid falls below the reference concentration, the removal of the unnecessary gas may be omitted at both of the upstream tank 84 and the downstream tank 89, or may be omitted at only the downstream tank 89.

The etching liquid such as the TMAH may be supplied not to the upper surface of the substrate W but to the lower surface of the substrate W. Alternatively, the etching liquid may be supplied to both the upper surface and the lower surface of the substrate W. In these cases, the lower surface nozzle 15 may be used to discharge the etching liquid.

The tubular portion 37 may be omitted from the shielding member 33. The upper support portions 43 and the lower support portions 44 may be omitted from the shielding member 33 and spin chuck 10.

The shielding member 33 may be omitted from the processing unit 2. In this case, the processing unit 2 may include a nozzle that discharges the processing liquid such as the first chemical liquid toward the substrate W. The nozzle may be a scan nozzle that is horizontally movable in the chamber 4, or may be a fixed nozzle that is fixed with respect to the partition wall 6 of the chamber 4.

The nozzle may include a plurality of liquid discharge ports that supply the processing liquid to the upper surface or the lower surface of the substrate W by simultaneously discharging the processing liquid toward a plurality of positions away in the radial direction of the substrate W. In this case, at least one of the flow rate, the temperature and the concentration of the processing liquid to be discharged may be changed for each of the liquid discharge ports.

The substrate processing apparatus 1 may be a batch type apparatus that processes a plurality of substrates in a batch. That is, the processing unit 2 may include an inner bath that stores the processing liquid, an outer bath that stores the processing liquid overflowed from the inner bath, and a lifter that rises and falls between a lower position in which the plurality of the substrates W are immersed in the processing liquid in the inner bath and a upper position in which the plurality of the substrates W are disposed above the processing liquid in the inner bath while simultaneously holding the plurality of the substrates W. In this case, the second chemical liquid piping (refer to FIG. 7) may be connected to the inner bath and the upstream piping may be connected to the outer bath.

The substrate processing apparatus 1 is not restricted to an apparatus for processing a disc-shaped substrate W, and may be an apparatus for processing a polygonal substrate W.

Two or more arrangements among all the arrangements described above may be combined. Two or more steps among all the steps described above may be combined.

The chemical liquid supplying unit 71 is an example of the processing liquid supplying unit. The chemical liquid collecting unit 81 is an example of the processing liquid collecting unit. The upstream valve 83 is an example of the collecting switching valve. The upstream tank 84 is an example of the collecting tank, the first upstream tank and the second upstream tank. The degasifier 85 is an example of the unnecessary gas decreasing unit, the first unnecessary gas decreasing unit and the second unnecessary gas decreasing unit. The downstream tank 89 is an example of the collecting tank. The first oxygen meter 96 is an example of oxygen meter. The gas dissolving unit 101 is an example of the dissolved oxygen concentration adjusting unit, the unnecessary gas decreasing unit and the gas dissolving unit. The upstream individual valve 125 is an example of the collecting switching valve.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
    a processing liquid storing step of storing a processing liquid by a supplying tank;
    a dissolved oxygen concentration measuring step of measuring a dissolved oxygen concentration of the processing liquid;
    a dissolved oxygen concentration adjusting step of adjusting the dissolved oxygen concentration of the processing liquid stored in the supplying tank by supplying a concentration adjusting gas having a concentration of inert gas higher than that of air into the supply tank in accordance with the dissolved oxygen concentration of the processing liquid measured in the dissolved oxygen concentration measuring step;
    a processing liquid supplying step of supplying the processing liquid in the supplying tank to a substrate;
    a processing liquid collecting step of collecting the processing liquid that has been supplied to the substrate into the supply tank; and
    an unnecessary gas decreasing step of decreasing an unnecessary gas, that is a gas other than the concentration adjusting gas and dissolved in the processing liquid in the processing liquid supplying step, from the processing liquid before the processing liquid that has been supplied to the substrate is collected into the supply tank.

2. The substrate processing method according to claim 1, wherein the unnecessary gas decreasing step includes a degassing step of decreasing a total amount of gas dissolved in the processing liquid before the processing liquid that has been supplied to the substrate is collected into the supply tank.

3. The substrate processing method according to claim 1, wherein the unnecessary gas decreasing step includes a gas dissolving step of replacing the unnecessary gas dissolved in the processing liquid with the concentration adjusting gas by dissolving the concentration adjusting gas into the processing liquid before the processing liquid that has been supplied to the substrate is collected into the supply tank.

4. The substrate processing method according to claim 1, wherein the processing liquid collecting step includes an intermediate collecting step of causing the processing liquid to flow into a collecting tank before the processing liquid that has been supplied to the substrate is collected into the supply tank, and
    the unnecessary gas decreasing step includes a step of decreasing the unnecessary gas from the processing liquid in the collecting tank.

5. The substrate processing method according to claim 4, wherein the unnecessary gas decreasing step includes a gas dissolving step of dissolving the concentration adjusting gas into the processing liquid in the collecting tank by supplying the concentration adjusting gas into the collecting tank.

6. The substrate processing method according to claim 1, wherein the processing liquid collecting step includes an upstream collecting step of causing the processing liquid to flow into an upstream tank before the processing liquid that has been supplied to the substrate is collected into the supply tank, and a downstream collecting step of causing the processing liquid to flow from the upstream tank to a downstream tank before the processing liquid in the upstream tank is collected into the supply tank, and
    the unnecessary gas decreasing step includes a degassing step of decreasing a total amount of gas dissolved in the processing liquid in the upstream tank, and a gas dissolving step of dissolving the concentration adjusting gas into the processing liquid in the downstream tank by supplying the concentration adjusting gas into the downstream tank.

7. The substrate processing method according to claim 1, wherein the processing liquid collecting step includes an intermediate collecting step of causing the processing liquid to flow into a collecting tank before the processing liquid that has been supplied to the substrate is collected into the supply tank,
    the substrate processing method further includes a liquid temperature determining step of determining whether or not a temperature of the processing liquid in the supply tank is not greater than a reference temperature,
    the unnecessary gas decreasing step includes a step of decreasing the unnecessary gas from the processing liquid in the collecting tank when the temperature of the processing liquid is determined to be not greater than the reference temperature in the liquid temperature determining step, and
    the processing liquid collecting step includes a step of sending the processing liquid in the collecting tank toward the supply tank without decreasing the unnecessary gas from the processing liquid in the collecting tank when the temperature of the processing liquid is determined to be greater than the reference temperature in the liquid temperature determining step.

8. The substrate processing method according to claim 1, wherein the processing liquid collecting step includes an intermediate collecting step of causing the processing liquid to flow into a collecting tank before the processing liquid that has been supplied to the substrate is collected into the supply tank, the substrate processing method further includes an unnecessary gas concentration measuring step of measuring a concentration of the unnecessary gas in the processing liquid before the processing liquid that has been supplied to the substrate is sent from the collecting tank toward the supply tank, and a concentration determining step of determining whether or not the concentration of the unnecessary gas in the processing liquid measured in the unnecessary gas concentration measuring step is not less than a reference concentration, the unnecessary gas decreasing step includes a step of decreasing the unnecessary gas from the processing liquid in the collecting tank when the concentration of the unnecessary gas is determined to be not less than the reference concentration in the concentration determining step, the processing liquid collecting step includes a step of sending the processing liquid in the collecting tank toward the supply tank without decreasing the unnecessary gas from the processing liquid in the collecting tank when the concentration of the unnecessary gas is determined to be less than the reference concentration in the concentration determining step.

9. The substrate processing method according to claim 1, wherein the processing liquid collecting step further includes
a first collecting step of causing the processing liquid to flow into a first upstream tank without causing the processing liquid to flow into a second tank that is connected in parallel to the first tank before the processing liquid that has been supplied to the substrate is collected into the supply tank, and a second collecting step of causing the processing liquid to flow into the second upstream tank without causing the processing liquid to flow into the first tank before the processing liquid that has been supplied to the substrate is collected into the supply tank, and the unnecessary gas decreasing step includes a first unnecessary gas decreasing step of decreasing the unnecessary gas from the processing liquid in the first upstream tank in parallel to the second collecting step, and a second unnecessary gas decreasing step of decreasing the unnecessary gas from the processing liquid in the second upstream tank in parallel to the first collecting step.

\* \* \* \* \*